(12) United States Patent
Yanagisawa et al.

(10) Patent No.: US 12,392,032 B2
(45) Date of Patent: Aug. 19, 2025

(54) SUBSTRATE PROCESSING APPARATUS WITH CLEANING OF EXHAUST SYSTEM

(71) Applicant: KOKUSAI ELECTRIC CORPORATION, Tokyo (JP)

(72) Inventors: Yoshihiko Yanagisawa, Toyama (JP); Naofumi Ohashi, Toyama (JP); Tadashi Takasaki, Toyama (JP); Shun Matsui, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 278 days.

(21) Appl. No.: 17/682,867

(22) Filed: Feb. 28, 2022

(65) Prior Publication Data

US 2022/0282369 A1 Sep. 8, 2022

(30) Foreign Application Priority Data

Mar. 3, 2021 (JP) ................. 2021-033215

(51) Int. Cl.
*C23C 16/44* (2006.01)
*C23C 16/52* (2006.01)
(Continued)

(52) U.S. Cl.
CPC ...... *C23C 16/4412* (2013.01); *C23C 16/4405* (2013.01); *C23C 16/52* (2013.01);
(Continued)

(58) Field of Classification Search
None
See application file for complete search history.

(56) References Cited

U.S. PATENT DOCUMENTS 10,685,832 B1 6/2020 Inada et al.
2010/0227046 A1* 9/2010 Kato ................. C23C 16/45563
118/712

(Continued)

FOREIGN PATENT DOCUMENTS

| CN | 104952683 A | 9/2015 |
| CN | 111696885 A | 9/2020 |
| JP | 2016-102242 A | 6/2016 |

OTHER PUBLICATIONS

Chinese Office Action issued on Jan. 19, 2024 for Chinese Patent Application No. 202111527706.X.

*Primary Examiner* — Binu Thomas
(74) *Attorney, Agent, or Firm* — Volpe Koenig

(57) ABSTRACT

There is provided a technique that includes: a process container processing one or more substrates; a support installed inside the process container and supporting the substrates; a first gas supplier capable of supplying gas in the process container; a second gas supplier capable of supplying in the process container; an exhaust buffer structure installed along outer circumference of the support; a third gas supplier capable of supplying first cleaning gas to the exhaust buffer structure; a fourth gas supplier capable of supplying second cleaning gas onto the support; and a controller configured to control the third and fourth gas suppliers to control a frequency or number of times for supplying each of the first and the second cleaning gas, or a supply time of each of the first and second cleaning gases, such that over-etching in the exhaust buffer structure or in the support is prevented.

17 Claims, 7 Drawing Sheets

(51) Int. Cl.
    *H01L 21/67*     (2006.01)
    *H01L 21/687*    (2006.01)
(52) U.S. Cl.
    CPC .. *H01L 21/67017* (2013.01); *H01L 21/68742* (2013.01); *H01L 21/68771* (2013.01)

(56) References Cited

U.S. PATENT DOCUMENTS

| | | | |
|---|---|---|---|
| 2015/0275357 A1* | 10/2015 | Kamakura | C23C 16/52 |
| | | | 438/758 |
| 2016/0153085 A1* | 6/2016 | Ueda | C23C 16/4412 |
| | | | 118/730 |
| 2017/0183777 A1* | 6/2017 | Ikegawa | C23C 16/4412 |
| 2019/0078198 A1* | 3/2019 | Umehara | C23C 16/4412 |
| 2020/0141001 A1* | 5/2020 | Kato | C23C 16/45551 |
| 2020/0243330 A1* | 7/2020 | Kubo | C23C 16/45565 |
| 2021/0071296 A1* | 3/2021 | Watarai | C23C 16/4412 |

* cited by examiner

A

B

C

D

E

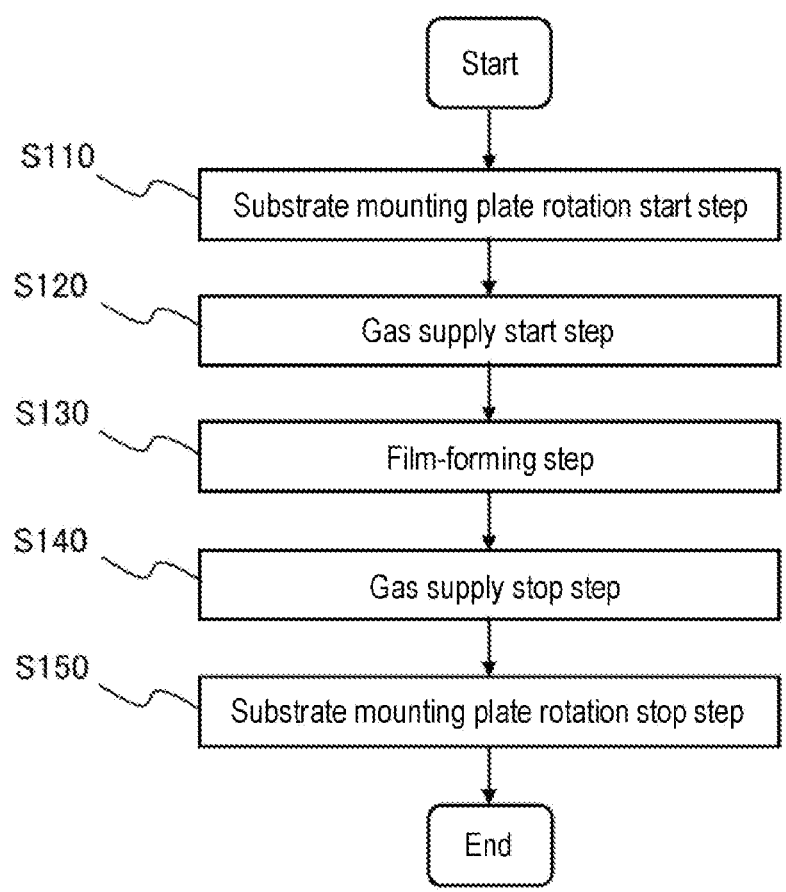

SUBSTRATE PROCESSING APPARATUS WITH CLEANING OF EXHAUST SYSTEM

CROSS-REFERENCE TO RELATED APPLICATION

This application is based upon and claims the benefit of priority from Japanese Patent Application No. 2021-033215, filed on Mar. 3, 2021, the entire contents of which are incorporated herein by reference.

TECHNICAL FIELD

The present disclosure relates to a substrate processing apparatus.

BACKGROUND

In the related art, as a substrate processing apparatus used in a semiconductor device manufacturing process, for example, there is an apparatus configured to arrange a plurality of substrates in a circumferential direction and perform a predetermined process (film-forming process or the like) on each of the substrates by sequentially supplying a first gas and a second gas to each of the substrates.

SUMMARY

Some embodiments of the present disclosure provide a technique capable of improving a cleaning efficiency of an exhaust system against a possibility that a first gas and a second gas may be mixed when exhausting supplied gases.

According to some embodiments of the present disclosure, there is provided a technique that includes: a process container configured to process one or more substrates; a support installed inside the process container and configured to support the one or more substrates on a plane of the support; a first gas supplier configured to be capable of supplying a first gas to a first domain set in the process container; a second gas supplier configured to be capable of supplying a second gas to a second domain set in the process container; an exhaust buffer structure installed along an outer circumference of the support; a first gas exhauster connected to the exhaust buffer structure and installed at a downstream side of a flow of the first gas supplied from the first gas supplier; a second gas exhauster connected to the exhaust buffer structure and installed at a downstream side of a flow of the second gas supplied from the second gas supplier; and a third gas supplier configured to be capable of supplying a cleaning gas to the exhaust buffer structure.

BRIEF DESCRIPTION OF DRAWINGS

The accompanying drawings, which are incorporated in and constitute a part of the specification, illustrate embodiments of the present disclosure.

FIG. 7 is a flowchart showing an example of a procedure of a substrate processing process executed by a substrate processing apparatus according to the embodiments of the present disclosure.

DETAILED DESCRIPTION

Figure 1:
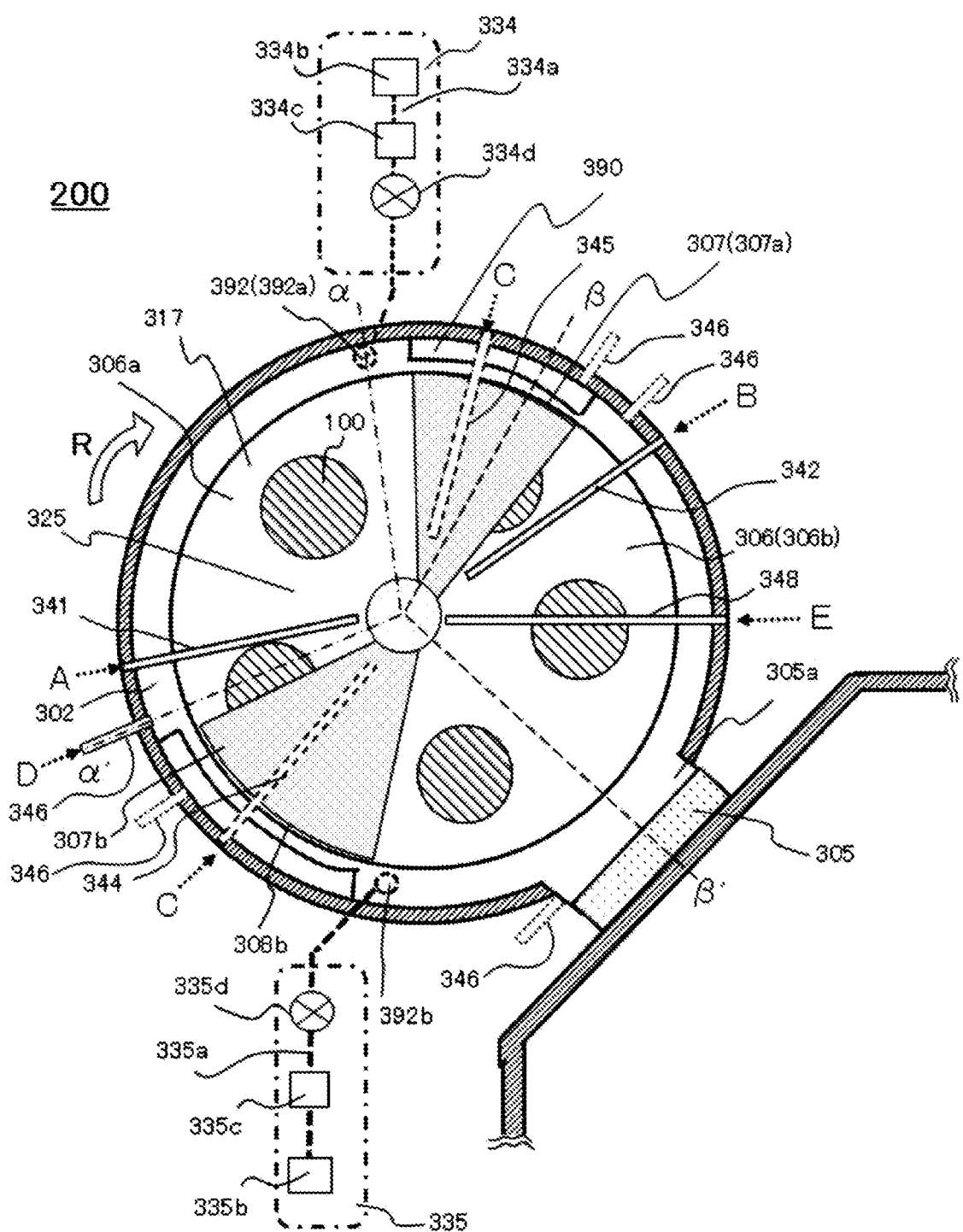
FIG. 1 is a schematic view of a cross section of a substrate processing apparatus according to embodiments of the present disclosure as viewed from above.

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are described in detail so as not to obscure aspects of the various embodiments.

Hereinafter, embodiments of the present disclosure will be described with reference to the drawings.

(1) Configuration of Substrate Processing Apparatus

A configuration of a substrate processing apparatus according to embodiments of the present disclosure will be described mainly with reference to FIGS. 1, 2, 3 and 4. The drawings used in the following description are schematic. Dimensional relationships among the respective elements shown in the drawings, ratios of the respective elements, and the like may not match actual ones. Further, even among the drawings, dimensional relationships among the respective elements, ratios of the respective elements, and the like may not match.

Figure 2:
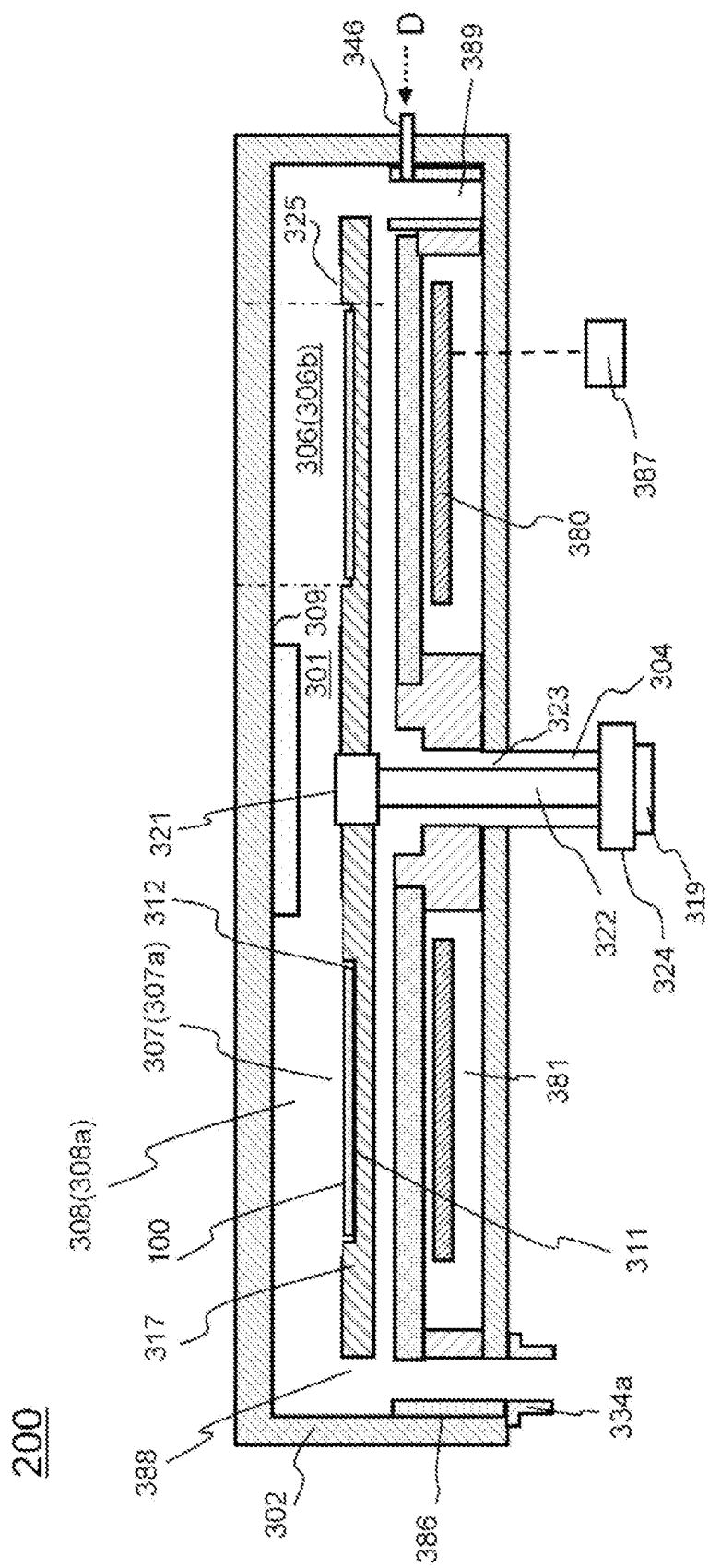
FIG. 2 is a schematic view of vertical section of a substrate processing apparatus according to embodiments of the present disclosure, which is taken along a line α-α' in FIG. 1.
Figure 3:
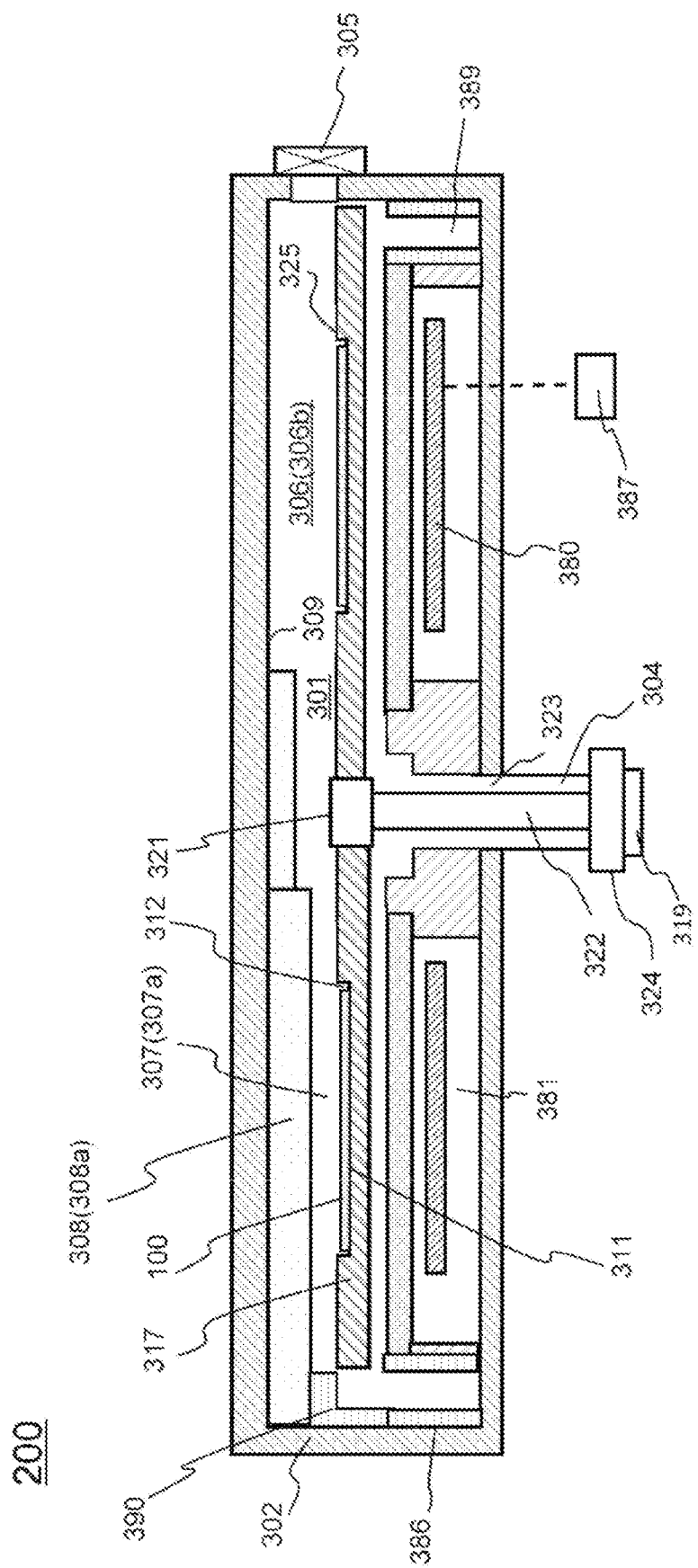
FIG. 3 is a schematic view of vertical section of a substrate processing apparatus according to embodiments of the present disclosure, which is taken along a line β-β' in FIG. 1.
Figure 4:
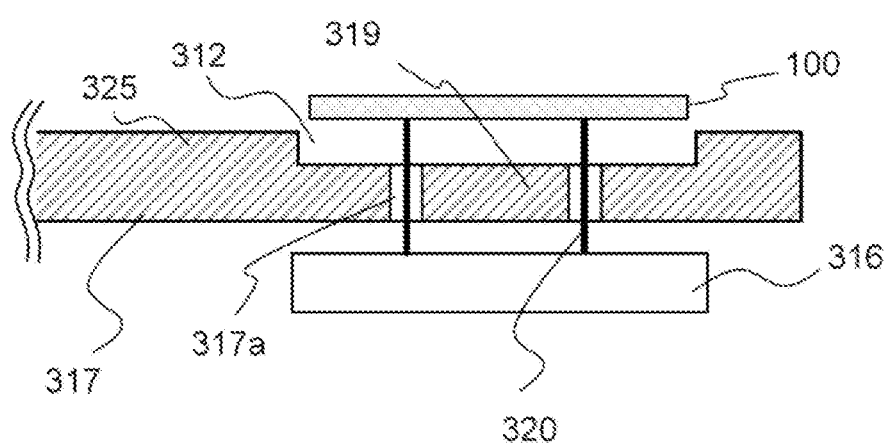
FIG. 4 is an explanatory diagram showing a configuration example of a substrate support mechanism in a substrate processing apparatus according to embodiments of the present disclosure.

FIG. 1 is a schematic view of cross section of a substrate processing apparatus 200 according to embodiments of the present disclosure as viewed from above. FIG. 2 is a schematic view of vertical section of the substrate processing apparatus 200 according to the embodiments of the present disclosure, which is taken along a line α-α' in FIG. 1. The line α-α' is a line extending from α to α' via a center of a chamber 302. FIG. 3 is a schematic view of vertical section of the substrate processing apparatus 200 according to the embodiments of the present disclosure, which is taken along a line β-β' in FIG. 1. The line β-β' is a line extending from δ to δ' via the center of a chamber 302. FIG. 4 is an explanatory diagram showing a configuration example of a substrate support mechanism in the substrate processing apparatus 200 according to the embodiments of the present disclosure.

(Chamber)

As shown in FIGS. 1, 2 and 3, the substrate processing apparatus 200 mainly includes a chamber 302 which is a cylindrical airtight container (process container). A process chamber 301 configured to process a substrate 100 is formed in the chamber 302. A gate valve 305 is connected to the chamber 302, and the substrate 100 is loaded and unloaded via the gate valve 305. The gate valve 305 is adjacent to a passage 305a. The substrate 100 is moved via the passage 305a.

In the process chamber 301, there are provided processing regions 306, which are domains (regions) to which processing gases are supplied, and purge regions 307, which are domains (regions) to which a purge gas is supplied. In the present disclosure, the processing regions 306 and the purge regions 307 are alternately arranged in a circumferential direction. For example, a first processing region 306a as a first domain, a first purge region 307a as a purge domain, a second processing region 306b as a second domain, and a second purge region 307b as a purge domain are arranged in the named order. As will be described later, a first gas is supplied into the first processing region 306a, a second gas is supplied into the second processing region 306b, and an inert gas is supplied into the first purge region 307a and the second purge region 307b. As a result, a predetermined process is performed on the substrate 100 according to the gas supplied into each region.

The purge regions 307 are regions that spatially separate the first processing region 306a and the second processing region 306b. Ceilings 308 of the purge regions 307 are configured to be lower than ceilings 309 of the processing regions 306. A ceiling 308a is installed at the first purge region 307a, and a ceiling 308b is installed at the second purge region 307b. By lowering each ceiling, a pressure in a space of the purge region 307 is increased. By supplying a purge gas to this space, the adjacent processing regions 306 are partitioned. Further, the purge gas removes an excess gas over the substrate 100.

In the chamber 302, a substrate mounting plate 317 is installed as a support configured to support the substrate 100. The substrate mounting plate 317 includes a rotation shaft arranged near the center of the chamber 302 and is configured to be rotatable. Further, the substrate mounting plate 317 is configured such that a plurality of (e.g., five) substrates 100 may be arranged on the same plane and on the same circumference along a rotation direction. The substrate mounting plate 317 is heat-transmittable such that it may transmit heat radiating from a heater 380 described later. The transmitted heat is used to heat the substrate 100. The substrate mounting plate 317 is made of, for example, quartz.

A surface of the substrate mounting plate 317 includes substrate mounting surfaces 311 on which the substrates 100 are mounted and non-substrate-mounting surfaces 325 other than the substrate mounting surfaces 311.

The substrate mounting surfaces 311 are arranged at equal intervals (e.g., intervals of 72°) at positions concentric with the center of the substrate mounting plate 317. In FIG. 1, illustration of the substrate mounting surfaces 311 is omitted for convenience of explanation. The substrate mounting surfaces 311 are formed on bottom surfaces of recesses 312. Each recess 312 is formed in, for example, a circular shape when viewed from the upper surface of the substrate mounting plate 317 and is formed in a concave shape when viewed from the side surface. A diameter of each of the recesses 312 is slightly larger than a diameter of the substrate 100. By mounting the substrate 100 in each of the recesses 312, the substrate 100 may be mounted on each of the substrate mounting surfaces 311.

The non-substrate-mounting surface 325 is a surface other than the substrate mounting surface 311 and is a surface on which the substrate 100 is not mounted. For example, the surface among the recesses 312, the surface forming a region on the center side of the chamber 302 when viewed from the recesses 312, the surface forming an outer peripheral region of the chamber 302 when viewed from the recesses 312, and the like correspond to the non-substrate-mounting surface 325.

Each of the recesses 312 constituting the substrate mounting surfaces 311 is provided with a plurality of through-holes 317a through which lift pins 320 pass. A substrate holding mechanism 316 shown in FIG. 4 is installed below the substrate mounting plate 317 at a location facing the gate valve 305. The substrate holding mechanism 316 includes a plurality of lift pins 320 that push up the substrate 100 and support the back surface of the substrate 100 when loading and unloading the substrate 100. The lift pins 320 is configured to be stretchable and may be accommodated in, for example, a main body of the substrate holding mechanism 316. When the substrate 100 is transferred, the lift pins 320 are stretched to hold the substrate 100. Thereafter, tips of the lift pins 320 are moved downward such that the substrate 100 is mounted in the recess 312. The substrate holding mechanism 316 may be formed in any configuration as long as the lift pins 320 may be inserted into the through-holes 317a when mounting the substrate.

The substrate mounting plate 317 is fixed to a core portion 321. The core portion 321 is provided at the center of the substrate mounting plate 317 to fix the substrate mounting plate 317. A shaft 322 is arranged below the core portion 321. The shaft 322 supports the core portion 321.

A lower portion of the shaft 322 penetrates the hole 323 formed at the bottom of the chamber 302 and is covered with an airtight bellows 304 outside the chamber 302. Further, a rotator 319 is installed at the lower end of the shaft 322. When the rotator 319 may also raise or lower the shaft 322, it may be referred to as an elevating rotator. The rotator 319 is configured to be capable of rotating the substrate mounting plate 317 according to an instruction of a controller 400 described later.

Below the substrate mounting plate 317, a heater unit 381 including a heater 380 as a heating part (heater part) is arranged. The heater 380 heats each of the substrates 100 mounted on the substrate mounting plate 317. The heater 380 is arranged in a circumferential direction in conformity with the shape of the chamber 302. A heater controller 387 is connected to the heater 380. The heater 380 is electrically connected to a controller 400 which will be described later. A power supplied to the heater 380 is controlled according to the instruction of the controller 400 to control the temperature.

An exhaust buffer structure 386 is installed at the outer peripheral side of the substrate mounting plate 317 to extend along the outer periphery of the substrate mounting plate 317. The exhaust buffer structure 386 includes an exhaust groove 388 and an exhaust buffer space 389. The exhaust groove 388 and the exhaust buffer space 389 are formed in a circumferential direction in conformity with the shape of the chamber 302.

Exhaust holes 392 are formed at the bottom of the exhaust buffer structure 386. The exhaust holes 392 exhaust the gas supplied into the chamber 302. Each gas is exhausted from the exhaust holes 392 via the exhaust groove 388 and the exhaust buffer space 389 that constitute the exhaust buffer structure 386.

Protrusions 390 are provided at portions of the exhaust buffer structure 386 adjacent to the purge regions 307. The protrusions 390 are configured to extend from the outer periphery of the exhaust buffer structure 386 toward the substrate mounting plate 317. By providing the protrusions 390, the inert gas supplied from the purge regions 307 may be prevented from flowing in a large amount through the exhaust buffer structure 386, which makes it possible to block the gas flowing from the upstream side.

(Gas Supplier)

Next, the gas supplier configured to supply gases to the chamber 302 will be described mainly with reference to FIGS. 1, 2 and 5A to 5E. FIGS. 5A to 5E are explanatory diagrams illustrating configuration examples of a gas supplier in the substrate processing apparatus 200 according to the embodiments of the present disclosure.

As shown in FIGS. 1 and 2, a nozzle 341 extending to the first processing region 306a, a nozzle 342 extending to the second processing region 306b, a nozzle 344 extending to the first purge region 307a, a nozzle 345 extending to the second purge region 307b, a nozzle 346 extending to the exhaust buffer structure 386, and a nozzle 348 extending onto the substrate mounting plate 317 in the process chamber 301 are installed at the chamber 302, there are installed. "A" in FIG. 1 is connected to "A" in FIG. 5A. That is, the nozzle 341 is connected to a supply pipe 241. "B" in FIG. 1 is connected to "B" in FIG. 5B. That is, the nozzle 342 is connected to a supply pipe 251. "C" in FIG. 1 is connected to "C" in FIG. 5C. That is, the nozzle 344 and the nozzle 345 are respectively connected to a supply pipe 261. "D" in FIG. 2 is connected to "D" in FIG. 5D. That is, the nozzle 346 is connected to a supply pipe 271. "E" in FIG. 1 is connected to "E" in FIG. 5E. That is, the nozzle 348 is connected to a supply pipe 281.

Figure 5A:
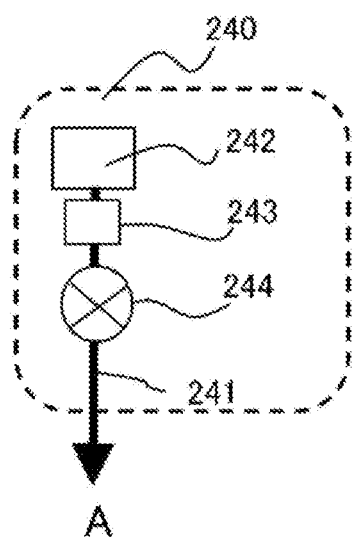
FIGS. 5A to 5E are explanatory diagrams illustrating configuration examples of a gas supplier in a substrate processing apparatus according to embodiments of the present disclosure.

FIG. 5A shows a configuration example of a first gas supplier 240, which is included in the gas supplier. At the first gas supply pipe 241 of the first gas supplier 240, a first gas supply source 242, an MFC 243 as a flow rate controller (flow rate control part), and a valve 244 as an on-off valve are installed sequentially from the upstream side.

A gas containing a first element (hereinafter referred to as "first gas") is mainly supplied from the first gas supply pipe 241 of the first gas supplier 240. That is, the first gas is supplied to the nozzle 341 via the MFC 243, the valve 244 and the first gas supply pipe 241. Then, the first gas is supplied to the first processing region 306a via the nozzle 341.

The first gas is a processing gas and is a precursor gas containing a first element. In the present disclosure, the first element is, for example, silicon (Si). That is, the first gas is a Si gas (also referred to as a Si-containing gas), which is a gas containing Si as a main component. Specifically, a dichlorosilane (DCS, $SiH_2Cl_2$) gas is used as the first gas.

The first gas supplier 240 mainly includes the first gas supply pipe 241, the MFC 243, the valve 244 and the nozzle 341. The first gas supply source 242 may be included in the first gas supplier 240.

Figure 5B:
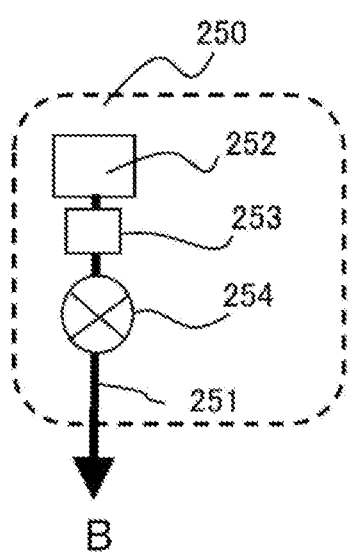

FIG. 5B shows a configuration example of a second gas supplier 250, which is included in the gas supplier. At the second gas supply pipe 251 of the second gas supplier 250, a second gas supply source 252, an MFC 253 as a flow rate controller (flow rate control part), and a valve 254 are installed sequentially from the upstream side.

A reaction gas (hereinafter referred to as "second gas") that reacts with the first gas is mainly supplied from the second gas supply pipe 251 of the second gas supplier 250. That is, the second gas is supplied to the nozzle 342 via the MFC 253, the valve 254 and the second gas supply pipe 251. Then, the second gas is supplied to the second processing region 306b via the nozzle 342.

The second gas is a processing gas, for example, a nitrogen-containing gas containing nitrogen as a main component. As the nitrogen-containing gas, for example, an ammonia ($NH_3$) gas is used.

The second gas supplier 250 mainly includes the second gas supply pipe 251, the MFC 253, the valve 254 and the nozzle 342. The second gas supply source 252 may be included in the second gas supplier 250. Since the second gas supplier 250 is configured to supply the reaction gas, it may be referred to as a reaction gas supplier.

Figure 5C:
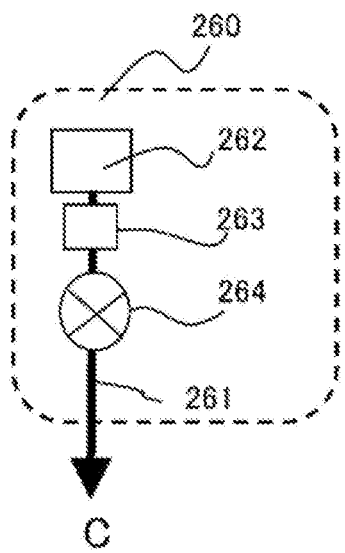

FIG. 5C shows a configuration example of a purge gas (inert gas) supplier 260, which is included in the gas supplier. At the purge gas supply pipe 261 of the purge gas supplier 260, a purge gas supply source 262, an MFC 263 as a flow rate controller (flow rate control part), and a valve 264 are installed sequentially from the upstream side.

A purge gas (inert gas) is supplied from the purge gas supply pipe 261 of the purge gas supplier 260. That is, the purge gas is supplied to each of the nozzle 344 and the nozzle 345 via the MFC 263, the valve 264 and the purge gas supply pipe 261. Then, the purge gas is supplied to the first purge region 307a via the nozzle 344 and is supplied to the second purge region 307b via the nozzle 345.

The purge gas is a gas that does not react with the first gas, the second gas, or the like. The purge gas is a gas that purges an atmosphere in the process chamber 301, and is, for example, a nitrogen ($N_2$) gas.

The purge gas supplier 260 mainly includes the purge gas supply pipe 261, the MFC 263, the valve 264, the nozzle 344 and the nozzle 345. The purge gas supply source 262 may be included in the purge gas supplier 260.

The first gas supplier 240 and the second gas supplier 250 are collectively referred to as a processing gas supplier. The purge gas supplier 260 may be included in the processing gas supplier.

Figure 5D:
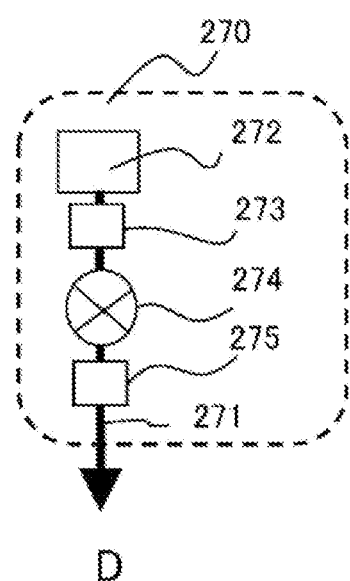

FIG. 5D shows a configuration example of a third gas supplier 270, which is included in the gas supplier. At the third gas supply pipe 271 of the third gas supplier 270, a third gas supply source 272, an MFC 273 as a flow rate controller (flow rate control part) and a valve 274 are installed sequentially from the upstream side.

A cleaning gas is supplied from the third gas supply pipe 271 of the third gas supplier 270. That is, the cleaning gas is supplied to the nozzle 346 via the MFC 273, the valve 274 and the third gas supply pipe 271. Then, the cleaning gas is supplied to the exhaust buffer structure 386 via the nozzle 346.

The cleaning gas is a gas to remove by-products produced by the reaction between the first gas and the second gas. For example, a trifluoride ($NF_3$) gas or a fluorine ($F_2$) gas is used as the cleaning gas.

The third gas supplier 270 mainly includes the third gas supply pipe 271, the MFC 273, the valve 274 and the nozzle 346. The third gas supply source 272 may be included in the third gas supplier 270. Further, the third gas supplier 270 may include an activator (hereinafter also referred to as "first activator") 275 configured to activate the cleaning gas. The details of the first activator 275 will be described later.

Figure 5E:
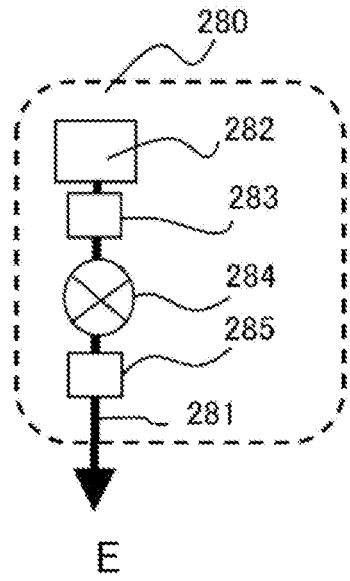

FIG. 5E shows a configuration example of a fourth gas supplier 280, which is included in the gas supplier. At the fourth gas supply pipe 281 of the fourth gas supplier 280, a fourth gas supply source 282, an MFC 283 as a flow rate controller (flow rate control part) and a valve 284 are installed sequentially from the upstream side.

A cleaning gas is supplied from the fourth gas supply pipe 281 of the fourth gas supplier 280. That is, the cleaning gas is supplied to the nozzle 348 via the MFC 283, the valve 284 and the fourth gas supply pipe 281. Then, the cleaning gas is supplied onto the substrate mounting plate 317 in the process chamber 301 via the nozzle 348.

The cleaning gas is a gas to remove by-products produced by the reaction between the first gas and the second gas. For example, a $NF_3$ gas or a $F_2$ gas is used as the cleaning gas. However, the cleaning gas may contain components different from those of the cleaning gas supplied by the third gas supplier 270.

The fourth gas supplier 280 mainly includes the fourth gas supply pipe 281, the MFC 283, the valve 284 and the nozzle 348. The fourth gas supply source 282 may be included in the fourth gas supplier 280. Further, the fourth gas supplier 280 may include an activator (hereinafter also referred to as "second activator") 285 configured to activate the cleaning gas. The details of the second activator 285 will be described later.

As each of the first activator 275 and the second activator 285, for example, a plasma generator, a heating catalyst, a second heater different from the heater 380, or a microwave supplier may be used.

(Gas Exhauster)

Next, a gas exhauster configured to exhaust a gas from the chamber 302 will be described mainly with reference to FIGS. 1 and 2.

As shown in FIG. 1, exhaust holes 392 are formed below the exhaust buffer structure 386 in the chamber 302. The exhaust hoes 392 are formed at the respective processing regions 306. Specifically, an exhaust hole 392*a* is formed to correspond to the first processing region 306*a*, and an exhaust hole 392*b* is formed to correspond to the second processing region 306*b*. That is, the exhaust hole 392*a* is arranged at the downstream side of the gas flow from the first gas supplier 240 configured to supply a gas to the first processing region 306*a*, and the exhaust hole 392*b* is arranged at the downstream side of the gas flow from the second gas supplier 250 configured to supply a gas to the second processing region 306*b*.

A first gas exhauster 334, which is included in the gas exhauster, is connected to the exhaust hole 392*a* arranged below the exhaust buffer structure 386 to correspond to the first processing region 306*a*. That is, the first exhaust pipe 334*a* included in the first gas exhauster 334 is connected to the chamber 302 to be in fluid communication with the exhaust hole 392*a*. A vacuum pump 334*b* as a vacuum-exhauster is connected to the first exhaust pipe 334*a* via a valve 334*d* as an on-off valve and an APC (Auto Pressure Controller) valve 334*c* as a pressure regulator (pressure regulation part). As a result, the first gas exhauster 334 is configured to be capable of vacuum-exhausting the inside of the process chamber 301 to a predetermined pressure (vacuum degree) via the exhaust buffer structure 386.

The first gas exhauster 334 mainly includes the APC valve 334*c*, the valve 334*d*, the first exhaust pipe 334*a* and the exhaust hole 392*a*. The vacuum pump 334*b* may be included in the first gas exhauster 334.

A second gas exhauster 335, which is included in the gas exhauster, is connected to the exhaust hole 392*b* arranged below the exhaust buffer structure 386 to correspond to the second processing region 306*b*. That is, the second exhaust pipe 335*a* included in the second gas exhauster 335 is connected to the chamber 302 to be in fluid communication with the exhaust hole 392*b*. A vacuum pump 335*b* as a vacuum-exhauster is connected to the second exhaust pipe 335*a* via a valve 335*d* as an on-off valve and an APC valve 335*c* as a pressure regulator (pressure regulation part). As a result, the second gas exhauster 335 is configured to be capable of vacuum-exhausting the inside of the process chamber 301 to a predetermined pressure (vacuum degree) via the exhaust buffer structure 386.

The second gas exhauster 335 mainly includes the APC valve 335*c*, the valve 335*d*, the second exhaust pipe 335*a* and the exhaust hole 392*b*. The vacuum pump 335*b* may be included in the second gas exhauster 335.

(Controller)

Figure 6:
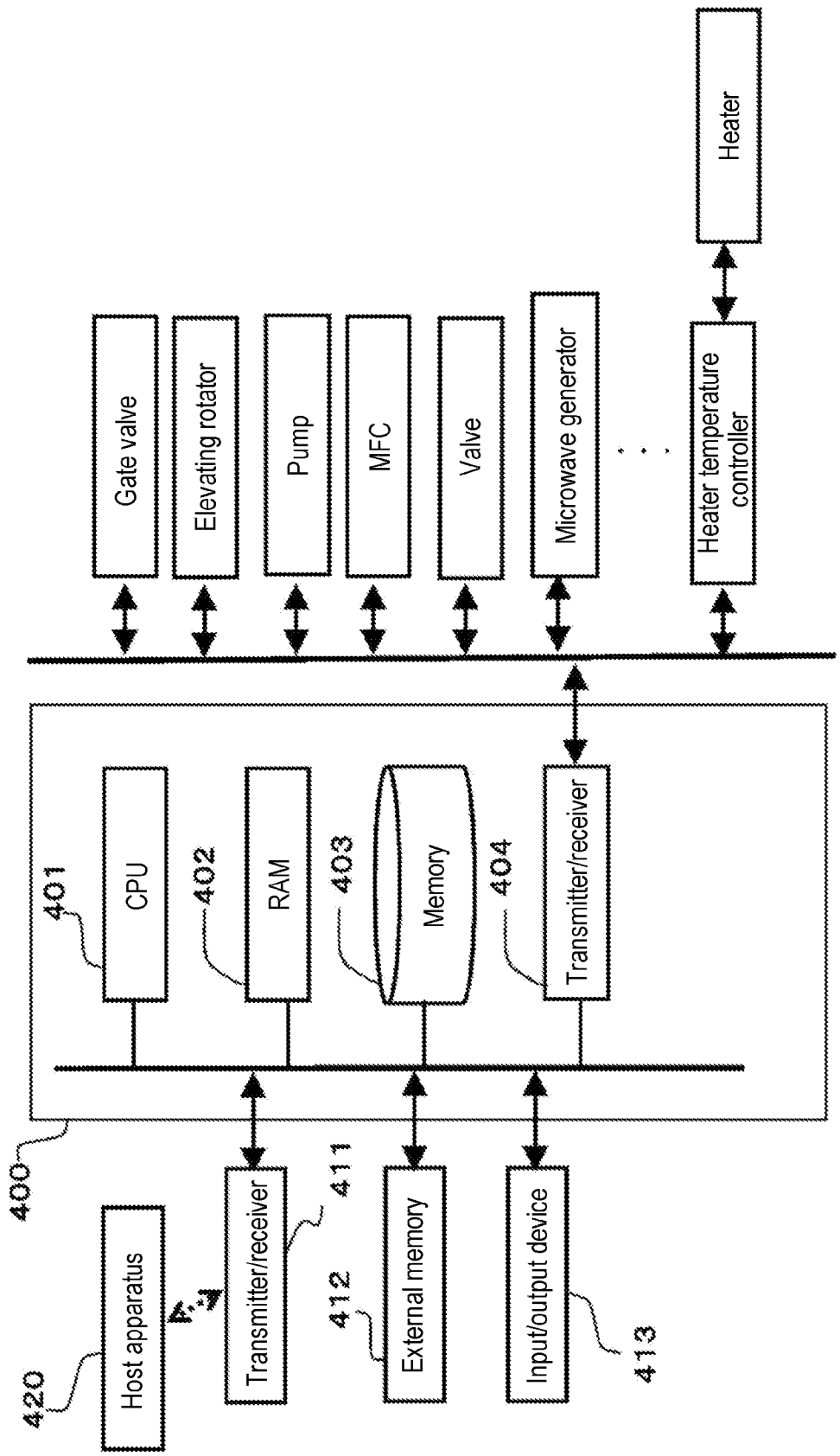
FIG. 6 is a block diagram showing an example of a functional configuration of a controller in a substrate processing apparatus according to embodiments of the present disclosure.

The substrate processing apparatus 200 configured as described above is controlled by a controller 400 as a control part (control unit or control means). Hereinafter, the controller 400 will be described mainly with reference to FIG. 6. FIG. 6 is a block diagram showing a functional configuration example of the controller 400 of the substrate processing apparatus 200 according to the embodiments of the present disclosure.

The substrate processing apparatus 200 includes a controller 400 configured to control operations of the respective components such as the microwave supplier, the elevating rotator, the valves, the MFCs and the like. The controller 400 includes at least a calculator (CPU) 401, a temporary memory 402, a memory 403, and a transmitter/receiver 404. The controller 400 is connected to the respective components of the substrate processing apparatus 200 via the transmitter/receiver 404. The controller 400 calls a program or a recipe from the memory 403 in response to an instruction from a host controller or a user and controls operations of the respective components according to contents of the program or the recipe. The controller 400 may be configured as a dedicated computer or a general-purpose computer. For example, the controller 400 according to the embodiments of the present disclosure may be configured by providing an external memory (e.g., a magnetic tape, a magnetic disc such as a flexible disc or a hard disc, an optical disc such as a CD or a DVD, a magneto-optical disc such as an MO or the like, and a semiconductor memory such as a USB memory (USB Flash Drive) or a memory card) 412 and installing a program on a general-purpose computer by using the external memory 412. Further, a unit or means to supply the program to the computer is not limited to the case of supplying the program via the external memory 412. For example, a communication unit or communication means such as the Internet or a dedicated line may be used. Information may be received from a host apparatus 420 via the transmitter/receiver 411 and the program may be supplied without going through the external memory 412. In addition, an input/output device 413 such as a keyboard or a touch panel may be used to give an instruction to the controller 400.

The memory 402 or the external memory 412 is configured as a computer-readable recording medium. Hereinafter, the memory 402 and the external memory 412 are collectively and simply referred to as a recording medium. When the term "recording medium" is used herein, it may include a case of including the memory 402, a case of including the external memory 412, or a case of including both.

(2) Substrate Processing Process

Next, a procedure in which a substrate processing process as a process of manufacturing a semiconductor device is performed by using the substrate processing apparatus 200 of the above-described configuration will be described. Description will be made on a case where in the substrate processing process, a silicon nitride (SiN) film is formed as a thin film on the substrate 100 by using a Si-containing gas as the first gas and using a $NH_3$ gas as the second gas.

Hereinafter, the substrate processing process will be described mainly with reference to FIG. 7. FIG. 7 is a flowchart showing an example of a procedure of the substrate processing process executed by the substrate processing apparatus 200 according to the embodiments of the present disclosure. In the following description, operations of the respective components constituting the substrate processing apparatus 200 are controlled by the controller 400.

(Substrate Loading/Mounting Step)

In the substrate processing process, first, a substrate loading/mounting step is performed. In FIG. 7, the substrate loading/mounting step is not illustrated.

In the substrate loading/mounting step, the substrate mounting plate 317 is rotated to move the recess 312 to a position adjacent to the gate valve 305. Then, the lift pins 320 are raised to penetrate the through-holes 317a of the substrate mounting plate 317. Subsequently, the gate valve 305 is opened to bring the chamber 302 into fluid communication with a vacuum transfer chamber (not shown). Then, the substrate 100 is transferred from this transfer chamber onto the lift pins 320 by using a wafer transfer machine (not shown). Thereafter, the lift pins 320 are lowered. As a result, the substrate 100 is supported on the substrate mounting surface 311.

After the substrate 100 is mounted on the substrate mounting surface 311, the substrate mounting plate 317 is rotated such that the substrate mounting surface 311 on which the substrate 100 is not mounted faces the gate valve 305. Thereafter, the substrate is similarly mounted on the substrate mounting surface 311. These are performed one or more times until the substrates 100 are mounted on the substrate mounting surfaces 311.

When the substrate 100 is mounted on the substrate mounting plate 317, electric power is supplied to the heater 380 in advance to control the temperature of the surface of the substrate 100 to a predetermined temperature. The temperature of the substrate 100 is, for example, 400 degrees C. or higher and 500 degrees C. or lower. The heat radiating from the heater 380 is applied to the back surface of the substrate 100 via the substrate mounting plate 317. The heater 380 is supplied with electric power at least from the substrate loading/mounting step to completion of a substrate unloading step described later.

(Substrate Mounting Plate Rotation Start Step)

After the substrates 100 are mounted in the respective recesses 312, the substrate mounting plate rotation start step (S110) is performed. In the substrate mounting plate rotation start step (S110), the rotator 324 rotates the substrate mounting plate 317 in the R direction. By rotating the substrate mounting plate 317, the substrate 100 moves through the first processing region 306a, the first purge region 307a, the second processing region 306b and the second purge region 307b in the named order.

(Gas Supply Start Process)

When the substrate 100 is heated to reach a desired temperature in the substrate loading/mounting process and the substrate mounting plate 317 reaches a desired rotation speed in the substrate mounting plate rotation start step (S110), then a gas supply start step (S120) is performed. In the gas supply start step (S120), the valve 244 is opened to start supplying a Si-containing gas into the first processing region 306a. At the same time, the valve 254 is opened to supply a $NH_3$ gas into the second processing region 306b.

At this time, the MFC 243 is regulated such that the flow rate of the Si-containing gas becomes a predetermined flow rate. The supply flow rate of the Si-containing gas is, for example, 50 sccm or more and 500 sccm or less.

Further, the MFC 253 is regulated such that the flow rate of the $NH_3$ gas becomes a predetermined flow rate. The supply flow rate of the $NH_3$ gas is, for example, 100 sccm or more and 5000 sccm or less.

After the substrate loading/mounting step is performed, the inside of the process chamber 301 is subsequently evacuated by the first gas exhauster 334 and the second gas exhauster 335, and a $N_2$ gas as a purge gas is supplied from the purge gas supplier 260 into the first purge region 307a and the second purge region 307b.

(Film-Forming Step)

Next, a film-forming step (S130) is performed. In the film-forming step (S130), a Si-containing layer is formed on each substrate 100 in the first processing region 306a, and the Si-containing layer reacts with the $NH_3$ gas in the second processing region 306b after rotation, whereby a Si-containing film is formed on the substrate 100. Then, the substrate mounting plate 317 is rotated a predetermined number of times such that a film thickness of the Si-containing film on the substrate 100 becomes a desired film thickness. At this time, the gases are also supplied to the non-substrate-mounting surface 325. Therefore, a film may be formed on the non-substrate-mounting surface 325 as well.

(Gas Supply Stop Step)

After the substrate mounting plate 317 is rotated a predetermined number of times in the film-forming step (S130), a gas supply stop step (S140) is performed. In the gas supply stop step (S140), the valve 244 and the valve 254 are closed to stop the supply of the Si-containing gas to the first processing region 306a and the supply of the $NH_3$ gas to the second processing region 306b.

(Substrate Mounting Plate Rotation Stop Step)

After the gas supply stop step (S140), a substrate mounting plate rotation stop step (S150) is performed. In the substrate mounting plate rotation stop step (S150), the rotation of the substrate mounting plate 317 is stopped.

(Substrate Unloading Step)

After the substrate mounting plate rotation stop step (S150), a substrate unloading step is performed. In FIG. 7, the substrate unloading step is not illustrated.

In the substrate unloading step, the substrate mounting plate 317 is rotated to move the substrate 100 to be unloaded to a position adjacent to the gate valve 305. Thereafter, the substrate 100 is unloaded in the reverse procedure to that of the substrate loading procedure. These operations are performed one or more times to unload all the substrates 100.

(3) Cleaning Process

As described above, in the substrate processing process, the Si-containing gas and the $NH_3$ gas are supplied to the substrate 100 in the process chamber 301 to form the SiN layer on the substrate 100. At that time, the gases are also supplied to the non-substrate-mounting surface 325 of the substrate mounting plate 317. Therefore, a film may also be formed on the non-substrate-mounting surface 325 by mixing of the Si-containing gas and the $NH_3$ gas. Further, the gases supplied into the process chamber 301 are exhausted by the first gas exhauster 334 and the second gas exhauster 335. At that time, the gases are moved via the exhaust buffer structure 386. Therefore, a film may also be formed on an inner wall of the exhaust buffer structure 386.

Since these films are films that are formed unintentionally, that is, films whose qualities are not controlled, a cleaning process may be performed to remove the films.

Hereinafter, the cleaning process executed by the substrate processing apparatus 200 according to the embodiments of the present disclosure will be described. In the following description, operations of the respective components constituting the substrate processing apparatus 200 are controlled by the controller 400.

(Cleaning Process of Exhaust Buffer Structure)

The exhaust buffer structure 386 may be subjected to a regular cleaning process because the Si-containing gas, which is the first gas, and the $NH_3$ gas, which is the second gas, may be mixed in the process of exhausting the gases supplied into the process chamber 301. Specifically, in the substrate processing process, the temperature is regulated in the process chamber 301 such that a quality-controlled film (hereinafter also referred to as "controlled film") is formed on the substrate 100. On the other hand, the temperature is not regulated in the exhaust buffer structure 386. Therefore, the temperature in the exhaust buffer structure 386 may different from that of the process chamber 301, for example, the temperature in the exhaust buffer structure 386 may be lower than that of the process chamber 301. Thus, an unintended film, that is, a film whose quality is not controlled (hereinafter also referred to as "uncontrolled film") may be formed. Since the uncontrolled film in the exhaust buffer structure 386 is formed under a temperature condition which is lower than a temperature condition under which the controlled film is formed, the uncontrolled film may be peeled off easily to become particles.

Therefore, the substrate processing apparatus 200 according to the embodiments of the present disclosure includes a third gas supplier 270 to reliably remove the uncontrolled film formed on the exhaust buffer structure 386. The third gas supplier 270 directly supplies a cleaning gas to the inside of the exhaust buffer structure 386. As a result, even when the gas exhausted from the process chamber 301 is moved via the exhaust buffer structure 386, it is possible to improve an efficiency of the cleaning process performed on the exhaust buffer structure 386. That is, the uncontrolled film formed on the exhaust buffer structure 386 may be efficiently and reliably removed by directly supplying the cleaning gas.

At this time, when the third gas supplier 270 includes the first activator 275, the cleaning gas supplied by the third gas supplier 270 may be activated by using the first activator 275. As the first activator 275, for example, any one of a plasma generator, a heating catalyst, a second heater different from the heater 380, and a microwave supplier may be used.

When the cleaning gas is activated by using such a first activator 275, even when the cleaning gas is supplied to the exhaust buffer structure 386 including no component (for example, a heater) configured to add energy, it is possible to add energy to the cleaning gas, which may further improve the efficiency of the cleaning process performed on the exhaust buffer structure 386.

The cleaning gas may be supplied to the exhaust buffer structure 386 as follows. For example, the third gas supplier 270 may be configured to be capable of supplying, as the cleaning gas, a first cleaning gas capable of removing a carbon-containing film and a second cleaning gas capable of removing a carbon-free film to the exhaust buffer structure 386. When supplying the cleaning gas to the exhaust buffer structure 386, the controller 400 controls the third gas supplier 270 to first supply the first cleaning gas and then supply the second cleaning gas. As the first cleaning gas, for example, an oxygen-based $O_3$ gas, a NO gas, or the like may be used. As the second cleaning gas, for example, a $NF_3$ gas may be used.

The cleaning gas may be supplied in this way, specifically when a gas containing carbon is used as the processing gas. An adsorption rate of carbon to the wall surface is higher than those of other components such as Si or the like. Therefore, the carbon may not be completely removed by normal cleaning, and a carbon-containing film containing carbon may remain easily. Thus, the first cleaning gas capable of removing a carbon-containing film is first supplied to vaporize a carbon component, and then the second cleaning gas capable of removing a carbon-free film is supplied to remove the entire film. That is, by supplying the first cleaning gas and the second cleaning gas, it is possible to efficiently and reliably remove the carbon-containing film.

(Cleaning Process of Non-Substrate-Mounting Surface)

The uncontrolled film may be formed on the non-substrate-mounting surface 325 of the substrate mounting plate 317, as well as on the exhaust buffer structure 386.

Therefore, the substrate processing apparatus 200 according to the embodiments of the present disclosure includes a fourth gas supplier 280 to reliably remove the uncontrolled film formed on the non-substrate-mounting surface 325. Then, the fourth gas supplier 280 supplies a cleaning gas onto the substrate mounting plate 317 in the process chamber 301. Thus, the uncontrolled film formed on the non-substrate-mounting surface 325 may be removed by supplying the cleaning gas onto the substrate mounting plate 317. The substrate mounting plate 317 is rotated while supplying the cleaning gas.

At this time, since the heater 380 is arranged below the substrate mounting plate 317, the heater 380 is used to heat the substrate mounting plate 317. By doing so, the cleaning process may be performed with the substrate mounting plate 317 kept in a heated state. Therefore, the efficiency of the cleaning process performed on the non-substrate-mounting surface 325 of the substrate mounting plate 317 becomes higher than that when the cleaning process is performed without heating.

The fourth gas supplier 280, which performs a cleaning process on the non-substrate-mounting surface 325, is installed higher than the third gas supplier 270, which performs a cleaning process on the exhaust buffer structure 386, in the direction in which gravity acts (hereinafter referred to as "gravity direction"). More specifically, the nozzle 348 constituting the fourth gas supplier 280 is installed higher than the nozzle 346 constituting the third gas supplier 270 in the vertical direction when the substrate processing apparatus 200 is installed. By arranging the nozzle 348 of the fourth gas supplier 280 on the upper side, the cleaning gas from the nozzle 348 may be supplied to the entire region on the substrate mounting plate 317, which makes it possible to efficiently perform the cleaning process on the non-substrate-mounting surface 325. Further, by arranging the nozzle 346 of the third gas supplier 270 on the lower side, the cleaning gas may be directly supplied to the exhaust buffer structure 386 which is a gas exhaust path from the inside of the chamber 302. This makes it possible to efficiently perform the cleaning process on the exhaust buffer structure 386.

(Relationship among Respective Cleaning Processes)

Now, the relationship between the cleaning process performed by the third gas supplier 270 and the cleaning process performed by the fourth gas supplier 280 will be described. As described above, both the cleaning gas supply from the third gas supplier 270 and the cleaning gas supply from the fourth gas supplier 280 are controlled by the controller 400.

For example, the controller 400 controls the third gas supplier 270 and the fourth gas supplier 280 such that, for example, the cleaning gas is supplied from the third gas supplier 270 to the exhaust buffer structure 386 while operating the first activator 275, and the cleaning gas is supplied from the fourth gas supplier 280 onto the substrate mounting plate 317 while operating the heater 380. When the respective cleaning processes are performed in this way, it is possible to perform the cleaning process on the substrate mounting plate 317 while heating the substrate mounting plate 317 with the heater 380. On the other hand, the exhaust buffer structure 386 is not easily affected by the heating performed by the heater 380. Instead, the first activator 275 may be used to increase the energy of the cleaning gas. Therefore, the cleaning process may be efficiently performed on both the non-substrate-mounting surface 325 of the substrate mounting plate 317 and the exhaust buffer structure 386.

Further, the controller 400 controls the third gas supplier 270 and the fourth gas supplier 280 such that, for example, a partial pressure of the cleaning gas when the third gas supplier 270 cleans the exhaust buffer structure 386 is higher than a partial pressure of the cleaning gas when the fourth gas supplier 280 performs the cleaning process on the substrate mounting plate 317. When the pressure of the cleaning gas in the exhaust buffer structure 386 is increased in this way, the cleaning gas is brought into contact with the uncontrolled film formed in the exhaust buffer structure 386 in a high-pressure state. Therefore, even when the exhaust buffer structure 386 does not include a heater, it is possible to improve the efficiency of the cleaning process performed on the exhaust buffer structure 386.

Further, the controller 400 controls the third gas supplier 270 and the fourth gas supplier 280 such that, for example, a frequency of the cleaning process performed on the exhaust buffer structure 386 performed by the third gas supplier 270 is higher than a frequency of the cleaning process performed on the substrate mounting plate 317 performed by the fourth gas supplier 280. On the substrate mounting plate 317, a film-forming condition such as a temperature is determined in the same manner as the substrate 100, whereby a film of high adhesion strength may be formed on the substrate mounting plate 317. On the other hand, the film-forming condition such as the temperature is determined on the exhaust buffer structure 386. Therefore, a film of weak adhesion strength may be formed on the exhaust buffer structure 386. That is, particles may be generated more frequently in the exhaust buffer structure 386 than on the substrate mounting plate 317. Therefore, in a case where the respective cleaning processes are performed at the same frequency, the substrate mounting plate 317 may be further cleaned in a state that the cleaning process is completed, which may cause over-etching. Accordingly, by increasing the frequency of the cleaning process performed on the exhaust buffer structure 386, it is possible to eliminate a risk of over-etching and to improve the efficiency of the respective cleaning processes.

Further, the controller 400 controls the third gas supplier 270 and the fourth gas supplier 280 such that, for example, a supply time of the cleaning gas supplied by the third gas supplier 270 to the exhaust buffer structure 386 is longer than a supply time of the cleaning gas supplied by the fourth gas supplier 280 onto the substrate mounting plate 317. In a case where the supply times of the cleaning gases in the respective cleaning processes are the same, over-etching may occur on the substrate mounting plate 317. Therefore, by increasing the supply time of the cleaning gas to the exhaust buffer structure 386, it is possible to eliminate the risk of over-etching and to improve the efficiency of the respective cleaning processes.

Further, when the adhesion strength of the uncontrolled film formed on the substrate mounting plate 317 is stronger than that of the uncontrolled film formed in the exhaust buffer structure 386, the controller 400 may control the third gas supplier 270 and the fourth gas supplier 280 such that, for example, the supply time of the cleaning gas supplied by the fourth gas supplier 280 onto the substrate mounting plate 317 is longer than the supply time of the cleaning gas supplied by the third gas supplier 270 to the exhaust buffer structure 386. In a case where the supply times of the cleaning gases in the respective cleaning processes are the same, over-etching may occur on the exhaust buffer structure 386. Therefore, by increasing the supply time of the cleaning gas to the substrate mounting plate 317, it is possible to eliminate the risk of over-etching and to improve the efficiency of the respective cleaning processes.

Further, the controller 400 controls the third gas supplier 270 and the fourth gas supplier 280 such that, for example, the supply of the cleaning gas onto the substrate mounting plate 317 by the fourth gas supplier 280 is stopped and the supply of the cleaning gas to the exhaust buffer structure 386 by the third gas supplier 270 is started after a predetermined time has elapsed from the supply of the cleaning gas onto the substrate mounting plate 317 by the fourth gas supplier 280. That is, after the non-substrate-mounting surface 325 of the substrate mounting plate 317 is cleaned, the exhaust buffer structure 386 is cleaned. In a case where the cleaning process is performed in the reverse order, foreign substances (by-products after removal, and the like.) generated in the cleaning process performed on the non-substrate-mounting surface 325 may adhere to the exhaust buffer structure 386. In this case, in a case where the cleaning process is performed on the exhaust buffer structure 386 after the cleaning process is performed on the non-substrate-mounting surface 325, it is possible to prevent foreign substances from adhering to the inside of the exhaust buffer structure 386 and to improve the efficiency of the respective cleaning processes.

Further, the controller 400 may control the third gas supplier 270 and the fourth gas supplier 280 such that, for example, the number of times the cleaning gas is supplied by the third gas supplier 270 to the exhaust buffer structure 386 is larger than the number of times the cleaning gas is supplied by the fourth gas supplier 280 onto the substrate mounting plate 317. In a case where the number of times the cleaning gas is supplied in the respective cleaning processes are the same, over-etching may occur on the substrate mounting plate 317 as in the case of the frequency described above. Therefore, by increasing the number of times the cleaning gas is supplied to the exhaust buffer structure 386, it is possible to eliminate the risk of over-etching and to improve the efficiency of the respective cleaning processes.

Further, in a case where a adhesion strength of the uncontrolled film on the substrate mounting plate 317 is stronger than that of the uncontrolled film in the exhaust buffer structure 386, the controller 400 may control the third gas supplier 270 and the fourth gas supplier 280 such that, for example, the number of times the cleaning gas is supplied by the fourth gas supplier 280 onto the substrate mounting plate 317 is larger than the number of times the cleaning gas is supplied by the third gas supplier 270 to the exhaust buffer structure 386. In a case where the number of times the cleaning gas is supplied in the respective cleaning processes are the same, over-etching may occur on the exhaust buffer structure 386. Therefore, by increasing the number of times the cleaning gas is supplied to the substrate mounting plate 317, it is possible to eliminate the risk of over-etching and to improve the efficiency of the respective cleaning processes.

Further, in a case where the fourth gas supplier 280 includes the second activator 285, the controller 400 may use the second activator 285 to activate the cleaning gas supplied by the fourth gas supplier 280. In the same manner as the first activator 275 of the third gas supplier 270, the second activator 285 may use, for example, any one of a plasma generator, a heating catalyst, a second heater different from the heater 380 and a microwave supplier. In such a case, the controller 400 controls the first activator 275 of the third gas supplier 270 and the second activator 285 of the fourth gas supplier 280 such that, for example, an amount of activation energy of the first activator 275 with respect to the cleaning gas supplied by the third gas supplier 270 is larger than an amount of activation energy of the second activator 285 with respect to the cleaning gas supplied by the fourth gas supplier 280. By doing so, it is possible to eliminate the risk of over-etching on the substrate mounting plate 317 while improving the efficiency of the cleaning process by activating the cleaning gas.

Further, in a case where the adhesion strength of the uncontrolled film formed on the substrate mounting plate 317 is stronger than that of the uncontrolled film formed in the exhaust buffer structure 386, the controller 400 controls the first activator 275 of the third gas supplier 270 and the second activator 285 of the fourth gas supplier 280 such that, for example, an amount of activation energy of the second activator 285 with respect to the cleaning gas supplied by the fourth gas supplier 280 is larger than an amount of activation energy of the first activator 275 with respect to the cleaning gas supplied by the third gas supplier 270. By doing so, it is possible to eliminate the risk of over-etching in the exhaust buffer structure 386 while improving the efficiency of the cleaning process by activating the cleaning gas.

The cleaning gas supplied from the third gas supplier 270 and the cleaning gas supplied from the fourth gas supplier 280 may be different in component from each other. In such a case, the respective cleaning gases are provided such that the by-product removal action (removal energy) by the cleaning gas supplied from the third gas supplier 270 is stronger than the by-product removal action (removal energy) by the cleaning gas supplied from the fourth gas supplier 280. By doing so, it is possible to eliminate the risk of over-etching on the substrate mounting plate 317 without making supply conditions of the respective cleaning gases different.

(Relationship with Purge Gas Supplier)

Next, a relationship between each of the cleaning processes by the third gas supplier 270 and the fourth gas supplier 280 and the purge gas supply by the purge gas supplier 260 will be described. As described above, the purge gas is supplied from the purge gas supplier 260 into the chamber 302. The purge gas supply from the purge gas supplier 260 is controlled by the controller 400.

The controller 400 controls the purge gas supplier 260 and the third gas supplier 270 such that, for example, the purge gas is supplied from the purge gas supplier 260 in parallel with the cleaning gas supply to the exhaust buffer structure 386 by the third gas supplier 270. Thus, when the exhaust buffer structure 386 is cleaned, the pressure in the process chamber 301 may be made higher than that in the exhaust buffer structure 386 by supplying the purge gas, whereby foreign substances (by-products after removal, and the like) generated when the exhaust buffer structure 386 is cleaned may be prevented from moving toward the process chamber 301. That is, even though the process chamber 301 and the exhaust buffer structure 386 are in fluid communication with each other, it is possible to appropriately perform the cleaning process on the exhaust buffer structure 386.

At this time, the controller 400 controls the purge gas supplier 260 and the third gas supplier 270 such that, for example, while supplying the cleaning gas from the third gas supplier 270 to the exhaust buffer structure 386, a partial pressure above the substrate mounting plate 317 is higher than a partial pressure in the exhaust buffer structure 386. By doing so, a pressure difference is generated between the upper side of the substrate mounting plate 317 and the exhaust buffer structure 386, whereby foreign substances may be reliably prevented from moving from the exhaust buffer structure 386 into the process chamber 301.

Specifically, the substrate mounting plate 317 is provided with the through-holes 317a through which the lift pins 320 supporting the substrate 100 pass. The controller 400 is configured to control the purge gas supplier 260 and the third gas supplier 270 such that, while supplying the cleaning gas from the third gas supplier 270 to the exhaust buffer structure 386, the partial pressure above the through-holes 317a is higher than the partial pressure in the exhaust buffer structure 386. By doing so, the partial pressure above the through-holes 317a may be increased. Therefore, even when the lift pins 320 pass through the through-holes 317a, the cleaning gas supplied to the exhaust buffer structure 386 and the foreign substances or the like removed by the cleaning gas do not swirl upward to the upper side of the substrate mounting plate 317 via the through-holes 317a.

(Nozzle Arrangement of Third Gas Supplier)

Next, a nozzle arrangement of the third gas supplier 270 controlled as described above will be described.

The nozzle 346 of the third gas supplier 270 may be arranged between the nozzle 341 of the first gas supplier 240 or the nozzle 342 of the second gas supplier 250 and the exhaust holes 392 (392a and 392b) installed below the exhaust buffer structure 386 in the gravity direction (vertical direction). Further, the nozzle 346 of the third gas supplier 270 may be arranged between the nozzle 341 of the first gas supplier 240 and the nozzle 342 of the second gas supplier 250 in the direction (horizontal direction) orthogonal to the gravity direction.

Further, the nozzle 346 of the third gas supplier 270 may be installed on the downstream side of the gas flow in the first purge region 307a and the second purge region 307b set between the first processing region 306a and the second processing region 306b.

Further, the nozzle 346 of the third gas supplier 270 may be installed below the protrusion 390.

Further, the chamber 302 includes a gate valve 305 that may be opened and closed, and a passage 305a formed between the gate valve 305 and the substrate mounting plate 317. The nozzle 346 of the third gas supplier 270 may be configured to be capable of supplying the cleaning gas to the passage 305a in the chamber 302 as well.

At each of these components, the mixing of the first gas (Si-containing gas, and the like) and the second gas ($NH_3$ gas and the like) is likely to occur and the foreign substances (by-products, and the like) to be removed in the cleaning process are likely to be accumulated. Specifically, on the downstream side of the first purge region 307a and the second purge region 307b as the purge domain, the gas just passed below the ceiling 308 or through a space between the protrusion 390 and the substrate mounting plate 317 or the ceiling 308, and the pressure on the gas may fluctuate to cause turbulent flow of the gas may occur. Thus, foreign substances are more likely to be accumulated than in other places. Further, since the space between the protrusion 390 and the substrate mounting plate 317 is narrow and the pressure is high in the space, foreign substances tend to be accumulated between the protrusion 390 and the substrate mounting plate 317. Further, in the vicinity of the gate valve 305, the gas collides with the wall constituting the passage 305a or the pressure on the gas fluctuates to generate the turbulent flow. Therefore, foreign substances tend to be accumulated in the passage 305a.

Even in that case, by arranging the nozzles described above, the third gas supplier 270 may supply fresh (non-deactivated) cleaning gas to each portion where foreign substances are likely to be accumulated. This makes it possible to improve the cleaning efficiency for each portion.

(Relationship between Third Gas Supplier and Gas Exhauster)

Next, a relationship between the third gas supplier 270 and the first gas exhauster 334 and the second gas exhauster 335 as the gas exhauster will be described. The gas exhaust from the chamber 302 by the first gas exhauster 334 and the second gas exhauster 335 is controlled by the controller 400.

The controller 400 controls the first gas exhauster 334, the second gas exhauster 335 and the third gas supplier 270 such that, for example, the cleaning gas supply from the third gas supplier 270 to the exhaust buffer structure 386, the stop of exhaust by the first gas exhauster 334, and the execution of exhaust by the second gas exhauster 335 are performed in parallel, or the cleaning gas supply from the third gas supplier 270 to the exhaust buffer structure 386, the execution of exhaust by the first gas exhauster 334, and the stop of exhaust by the second gas exhauster 335 are performed in parallel. In a case where the gas flow generated by an exhaust system of the first gas exhauster 334 or the second gas exhauster 335 is stopped in this way during the cleaning process on the exhaust buffer structure 386, the cleaning gas reaches the entire exhaust buffer structure 386. Therefore, the entire exhaust buffer structure 386 may be cleaned without omission.

Further, the controller 400 controls the first gas exhauster 334, the second gas exhauster 335, and the third gas supplier 270 such that, for example, the cleaning gas supply from the third gas supplier 270 to the exhaust buffer structure 386, and the exhaust control by which the amount of exhaust by the first gas exhauster 334 becomes larger than the amount of exhaust by the second gas exhauster 335 are performed in parallel or such that the cleaning gas supply from the third gas supplier 270 to the exhaust buffer structure 386, and the exhaust control by which the amount of exhaust by the first gas exhauster 334 becomes smaller than the amount of exhaust by the second gas exhauster 335 are performed in parallel. In a case where the volume of exhaust by an exhaust system of the first gas exhauster 334 or the second gas exhauster 335 is made small in this way during the cleaning process performed on the exhaust buffer structure 386, even when the gas flow generated by the exhaust system is not completely stopped, the cleaning gas tends to reach the entire exhaust buffer structure 386. Therefore, the entire exhaust buffer structure 386 may be cleaned without omission.

Further, the controller 400 controls the first gas exhauster 334, the second gas exhauster 335 and the third gas supplier 270 such that, for example, the cleaning gas supply from the third gas supplier 270 to the exhaust buffer structure 386, the stop of exhaust performed by the first gas exhauster 334, and the stop of exhaust performed by the second gas exhauster 335 are performed in parallel. In a case where the gas flows generated by the first gas exhauster 334 and the second gas exhauster 335 are stopped in this way during the cleaning process performed on the exhaust buffer structure 386, the cleaning gas may be confined in the exhaust buffer structure 386. This may be used in improving the efficiency of the cleaning process performed on the exhaust buffer structure 386.

Specifically, the confining of the cleaning gas in the exhaust buffer structure 386 may be used when a portion where the cleaning gas is difficult to enter, for example, the protrusion 390 of the exhaust buffer structure 386 is installed in the exhaust buffer structure 386. That is, in a case where a distance between the outer peripheral wall constituting the exhaust buffer structure 386 and the substrate mounting plate 317 is set such that the distance in the purge regions 307a and 307b is smaller than the distance in the first processing region 306a and the second processing region 306b as much as the protrusion 390 is installed, the cleaning gas may be confined in the exhaust buffer structure 386, which may improve the efficiency of the cleaning process performed on the exhaust buffer structure 386.

(4) Effects of the Embodiments

According to the embodiments of the present disclosure, one or more of the following effects may be obtained.

(a) According to the embodiments of the present disclosure, the third gas supplier 270 directly supplies the cleaning gas to the exhaust buffer structure 386. Therefore, in a case where the gas supplied into the chamber 302 is exhausted, even when the mixing of the first gas (Si-containing gas, and the like) and the second gas ($NH_3$ gas, and the like) may occur and the uncontrolled film may be formed in the exhaust buffer structure 386 serving as an exhaust path, it is possible to improve the efficiency of the cleaning process performed on the exhaust buffer structure 386. That is, by improving the cleaning efficiency of the exhaust system, it is possible to efficiently and reliably remove the uncontrolled film formed in the exhaust buffer structure 386.

(b) According to the embodiments of the present disclosure, the first activator 275 activates the cleaning gas supplied by the third gas supplier 270. Therefore, even when the cleaning gas is supplied to the exhaust buffer structure 386 including no configuration (for example, a heater) to add energy, it is possible to add energy to the cleaning gas and to further improve the efficiency of the cleaning process.

(c) According to the embodiments of the present disclosure, when the cleaning gas is supplied to the exhaust buffer structure 386, the first cleaning gas capable of removing a carbon-containing film is first supplied, and then the second cleaning gas capable of removing a carbon-free film is supplied, which may be used when a gas containing carbon is used as the processing gas, such that it is possible to remove the carbon-containing film efficiently and reliably.

(d) According to the embodiments of the present disclosure, the fourth gas supplier 280 supplies the cleaning gas onto the substrate mounting plate 317 in the process chamber 301. At that time, the heater 380 heats the substrate mounting plate 317. Therefore, the cleaning process may be performed with the substrate mounting plate 317 kept in a heated state. Therefore, the efficiency of the cleaning performed on the non-substratemounting surface 325 of the substrate mounting plate 317 may be improved as compared with the case where heating is not performed.

(e) According to the embodiments of the present disclosure, the fourth gas supplier 280 is installed above the third gas supplier 270 in the gravity direction. Therefore, the cleaning gas from the fourth gas supplier 280 on the upper side may be supplied to the entire region on the substrate mounting plate 317, and therefore the cleaning process performed on the non-substrate-mounting surface 325 may be efficiently performed. Moreover, by arranging the third gas supplier 270 on the lower side, the cleaning gas may be directly supplied to the exhaust buffer structure 386 which is a gas exhaust path from the inside of the chamber 302, and the cleaning process may be efficiently performed on the exhaust buffer structure 386.

(f) According to the embodiments of the present disclosure, the cleaning gas is supplied from the third gas supplier 270 to the exhaust buffer structure 386 while operating the first activator 275, and the cleaning gas is supplied from the fourth gas supplier 280 onto the substrate mounting plate 317 while operating the heater 380. Therefore, the cleaning process may be efficiently performed on both the non-substrate-mounting surface 325 of the substrate mounting plate 317 and the exhaust buffer structure 386.

(g) According to the embodiments of the present disclosure, the first activator 275 installed at the third gas supplier 270 is any one of a plasma generator, a heating catalyst, a second heater, and a microwave supplier. Therefore, the cleaning gas supplied by the third gas supplier 270 may be reliably activated, whereby the cleaning process may be performed on the exhaust buffer structure 386 efficiently.

(h) According to the embodiments of the present disclosure, the partial pressure of the cleaning gas when the third gas supplier 270 cleans the exhaust buffer structure 386 is set to be higher than the partial pressure of the cleaning gas when the fourth gas supplier 280 cleans the substrate mounting plate 317. Therefore, even when the exhaust buffer structure 386 does not include a heater, the efficiency of the cleaning process performed on the exhaust buffer structure 386 may be improved.

(i) According to the embodiments of the present disclosure, the frequency of the cleaning process performed on the exhaust buffer structure 386 performed by the third gas supplier 270 is set to be higher than the frequency of the cleaning process performed on the substrate mounting plate 317 performed by the fourth gas supplier 280. Therefore, when the cleaning processes are performed at the same frequency, the substrate mounting plate 317 may be over-etched. However, according to the embodiments of the present disclosure, it is possible to eliminate the risk of such over-etching and to improve the efficiency of each cleaning process.

(j) According to the embodiments of the present disclosure, the supply time of the cleaning gas supplied by the third gas supplier 270 to the exhaust buffer structure 386 is set to be longer than the supply time of the cleaning gas supplied by the fourth gas supplier 280 onto the substrate mounting plate 317. Therefore, when the supply times of the cleaning gas in the respective cleaning processes are the same, the substrate mounting plate 317 may be over-etched. However, according to the embodiments of the present disclosure, it is possible to eliminate the risk of such over-etching and to improve the efficiency of each cleaning process.

(k) According to the embodiments of the present disclosure, after a predetermined time has elapsed from the supply of the cleaning gas onto the substrate mounting plate 317 by the fourth gas supplier 280, the supply of the cleaning gas onto the substrate mounting plate 317 is stopped and the supply of the cleaning gas to the exhaust buffer structure 386 by the third gas supplier 270 is started. Therefore, there is no possibility that foreign substances (by-products after removal, etc.) generated in the cleaning process performed on the non-substrate-mounting surface 325 adheres to the exhaust buffer structure 386. Thus, it is possible to prevent foreign substances from adhering to the inside of the exhaust buffer structure 386, which may improve the efficiency of each cleaning process.

(l) According to the embodiments of the present disclosure, the number of times the cleaning gas is supplied by the third gas supplier 270 to the exhaust buffer structure 386 is set to be higher than the number of times the cleaning gas is supplied by the fourth gas supplier 280 onto the substrate mounting plate 317. Therefore, when the number of times the cleaning gas is supplied in the respective cleaning processes is the same, the substrate mounting plate 317 may be over-etched. However, according to the embodiments of the present disclosure, it is possible to eliminate the risk of such over-etching and to improve the efficiency of each cleaning process.

(m) According to the embodiments of the present disclosure, the amount of activation energy of the first activator 275 with respect to the cleaning gas supplied by the third gas supplier 270 is set to be larger than the amount of activation energy of the second activator 285 with respect to the cleaning gas supplied by the fourth gas supplier 280. Therefore, it is possible to eliminate the risk of over-etching on the substrate mounting plate 317 while improving the efficiency of the cleaning process by activating the cleaning gas.

(n) According to the embodiments of the present disclosure, the components of the cleaning gas supplied from the third gas supplier 270 and the components of the cleaning gas supplied from the fourth gas supplier 280 are different from each other. Specifically, the respective cleaning gases are provided such that, for example, the by-product removal action (removal energy) by the cleaning gas supplied from the third gas supplier 270 is stronger than the by-product removal action (removal energy) by the cleaning gas supplied from the fourth gas supplier 280. Therefore, it is possible to eliminate the risk of over-etching on the substrate mounting plate 317 without making supply conditions of the respective cleaning gases different.

(o) According to the embodiments of the present disclosure, the purge gas is supplied from the purge gas supplier 260 in parallel with the cleaning gas supply to the exhaust buffer structure 386 by the third gas supplier 270. Therefore, in the cleaning process performed on the exhaust buffer structure 386, the pressure in the process chamber 301 may be made higher than that in the exhaust buffer structure 386 by supplying the purge gas. Therefore, it is possible to prevent the foreign substances generated in the cleaning process performed on the exhaust buffer structure 386 from moving toward the process chamber 301. That is, even when the process chamber 301 and the exhaust buffer structure 386 are in fluid communication with each other, the cleaning process performed on the exhaust buffer structure 386 may be appropriately performed.

(p) According to the embodiments of the present disclosure, the purge gas is supplied from the purge gas supplier 260 such that while the third gas supplier 270 supplies the cleaning gas to the exhaust buffer structure 386, the partial pressure on the upper side of the substrate mounting plate 317 is higher than the partial pressure in the exhaust buffer structure 386. Therefore, since a pressure difference is generated between the upper side of the substrate mounting plate 317 and the exhaust buffer structure 386, it is possible to reliably suppress the movement of foreign substances from the exhaust buffer structure 386 into the process chamber 301.

(q) According to the embodiments of the present disclosure, the purge gas is supplied from the purge gas supplier 260 such that while the third gas supplier 270 supplies the cleaning gas to the exhaust buffer structure 386, the partial pressure on the upper side of the through-holes 317a is higher than the partial pressure in the exhaust buffer structure 386. This makes it possible to increase the partial pressure on the upper side of the through-holes 317a. Therefore, even when the lift pins 320 pass through the through-holes 317a, the cleaning gas supplied to the exhaust buffer structure 386 and the foreign substances removed by the cleaning gas do not swirl up to the upper side of the substrate mounting plate 317 via the through-holes 317a.

(r) According to the embodiments of the present disclosure, the third gas supplier 270 is arranged between the first gas supplier 240 or the second gas supplier 250 and the exhaust holes 392 (392a and 392b) installed below the exhaust buffer structure 386 in the gravity direction. Further, the third gas supplier 270 is arranged between the first gas supplier 240 and the second gas supplier 250 in the direction orthogonal to the gravity direction. Further, according to the embodiments of the present disclosure, the third gas supplier 270 is installed on the downstream side of the gas flow in the first purge region 307a and the second purge region 307b set between the first processing region 306a and the second processing region 306b. Further, according to the embodiments of the present disclosure, the third gas supplier 270 may also supply the cleaning gas to the passage 305a in the chamber 302. Each of these portions is a place where the mixing of the first gas (Si-containing gas, and the like) and the second gas ($NH_3$ gas, and the like) is likely to occur and the foreign substances to be removed in the cleaning process are likely to accumulate. Even in such a case, the third gas supplier 270 may supply a fresh (non-deactivated) cleaning gas to each portion where the foreign substances tend to be accumulated. This makes it possible to improve the efficiency of the cleaning process performed on each portion.

(s) According to the embodiments of the present disclosure, the cleaning gas supply from the third gas supplier 270 to the exhaust buffer structure 386, the stop of exhaust by the first gas exhauster 334, and the execution of exhaust by the second gas exhauster 335 are performed in parallel, and the cleaning gas supply from the third gas supplier 270 to the exhaust buffer structure 386, the execution of exhaust by the first gas exhauster 334, and the stop of exhaust by the second gas exhauster 335 are performed in parallel. Therefore, when the gas flow generated by the exhaust system of the first gas exhauster 334 or the second gas exhauster 335 is stopped during the cleaning process performed on the exhaust buffer structure 386, the cleaning gas reaches the entire exhaust buffer structure 386. Therefore, the entire exhaust buffer structure 386 may be cleaned without omission.

(t) According to the embodiments of the present disclosure, the cleaning gas supply from the third gas supplier 270 to the exhaust buffer structure 386, and the exhaust control by which the amount of exhaust by the first gas exhauster 334 becomes larger than the amount of exhaust by the second gas exhauster 335 are performed in parallel, or the cleaning gas supply from the third gas supplier 270 to the exhaust buffer structure 386, and the exhaust control by which the amount of exhaust by the first gas exhauster 334 becomes smaller than the amount of exhaust by the second gas exhauster 335 are performed in parallel. Therefore, the volume of exhaust by the exhaust system of the first gas exhauster 334 or the second gas exhauster 335 is made small during the cleaning process performed on the exhaust buffer structure 386, whereby even when the gas flow generated by the exhaust system is not completely stopped, the cleaning gas may reach the entire exhaust buffer structure 386 easily. Therefore, the entire exhaust buffer structure 386 may be cleaned without omission.

(u) According to the embodiments of the present disclosure, the cleaning gas supply from the third gas supplier 270 to the exhaust buffer structure 386, the stop of exhaust performed by the first gas exhauster 334 and the stop of exhaust performed by the second gas exhauster 335 are performed in parallel. Therefore, the gas flows generated by the first gas exhauster 334 and the second gas exhauster 335 may be stopped during the cleaning process performed on the exhaust buffer structure 386, which may confine the cleaning gas in the exhaust buffer structure 386. This may be used in improving the efficiency of the cleaning process performed on the exhaust buffer structure 386.

(v) According to the embodiments of the present disclosure, the cleaning gas is confined in the exhaust buffer structure 386. This may be used when a portion where the cleaning gas may not enter easily, such as the protrusion 390 of the exhaust buffer structure 386, is provided in the exhaust buffer structure 386. That is, since the cleaning gas may be supplied to the portion where the cleaning gas may not enter easily, the exhaust buffer structure 386 may be cleaned without omission.

(5) Modifications

Although the embodiments of the present disclosure are specifically described above, the present disclosure is not limited thereto, and various changes may be made without departing from the gist thereof.

For example, in the above-described embodiments, the DCS gas is taken as an example of the precursor gas which is the first gas. However, the present disclosure is not limited thereto. As the precursor gas, in addition to the DCS gas, it may be possible to use a chlorosilane precursor gas containing Si—Cl bonds, such as a hexachlorodisilane ($Si_2Cl_6$, abbreviation: HCDS) gas, a monochlorosilane ($SiH_3Cl$, abbreviation: MCS) gas, a trichlorosilane ($SiHCl_3$, abbreviation: TCS) gas, a tetrachlorosilane (SiCl$_4$, abbreviation: STC) gas, an octachlorotrisilane (Si$_3$Cl$_8$, abbreviation: OCTS) gas, or the like.

Further, for example, in the above-described embodiments, the NH$_3$ gas is taken as an example of the reaction gas which is the second gas. However, the present disclosure is not limited thereto. As the reaction gas, in addition to the NH$_3$ gas, it may be possible to use a hydrogen nitride-based gas containing N—H bonds such as a diazene (N$_2$H$_2$) gas, a hydrazine (N$_2$H$_4$) gas, a N$_3$H$_8$ gas, or the like.

Further, for example, in the above-described embodiments, the N$_2$ gas is taken as an example of the inert gas. However, the present disclosure is not limited thereto. As the inert gas, in addition to the N$_2$ gas, it may be possible to use a rare gas such as an Ar gas, a He gas, a Ne gas, a Xe gas, or the like.

Further, in the above-described embodiments, the film-forming process performed on the substrate 100 is taken as an example of the substrate processing process. However, the present disclosure is not limited thereto. The present disclosure may be applied to other processes as long as the processes include gas supply and gas exhaust. Examples of other processes include a diffusion process, an oxidation process, a nitriding process, an oxynitriding process, a reduction process, an oxidation-reduction process, an etching process, a heating process, and the like.

(6) Aspects of Present Disclosure

Hereinafter, some aspects of the present disclosure will be additionally described as supplementary notes.

(Supplementary Note 1)

According to some embodiments of the present disclosure, there is provided a substrate processing apparatus, including: a process container configured to process one or more substrates; a support installed inside the process container and configured to support the one or more substrates on a plane of the support; a first gas supplier configured to supply a first gas to a first domain set in the process container; a second gas supplier configured to supply a second gas to a second domain set in the process container; an exhaust buffer structure installed along an outer circumference of the support; a first gas exhauster connected to the exhaust buffer structure and installed at a downstream side of a flow of the first gas supplied from the first gas supplier; a second gas exhauster connected to the exhaust buffer structure and installed at a downstream side of a flow of the second gas supplied from the second gas supplier; and a third gas supplier configured to supply a cleaning gas to the exhaust buffer structure.

(Supplementary Note 2)

The substrate processing apparatus of Supplementary Note 1 may further include an activator configured to activate the cleaning gas.

(Supplementary Note 3)

In the substrate processing apparatus of Supplementary Note 1 or 2, the third gas supplier may be configured to be capable of supplying, as the cleaning gas, a first cleaning gas capable of removing a carbon-containing film and a second cleaning gas capable of removing a carbon-free film, and the third gas supplier may be configured to supply the first cleaning gas and then supply the second cleaning gas when the cleaning gas is supplied to the exhaust buffer structure.

(Supplementary Note 4)

The substrate processing apparatus of Supplementary Note 2 may further include: a fourth gas supplier configured to supply a cleaning gas onto the support; and a heater configured to heat the support.

(Supplementary Note 5)

In the substrate processing apparatus of Supplementary Note 4, the fourth gas supplier may be installed higher than the third gas supplier in a gravity direction (vertical direction).

(Supplementary Note 6)

In the substrate processing apparatus of Supplementary Note 4 or 5, the third gas supplier may be configured to supply a cleaning gas to the exhaust buffer structure in a state where the activator is in operation, and the fourth gas supplier may be configured to supply a cleaning gas onto the support in a state where the heater is in operation.

(Supplementary Note 7)

In the substrate processing apparatus of Supplementary Note 2 or 6, the activator may be any one of a plasma generator, a heating catalyst, a second heater, and a microwave supplier.

(Supplementary Note 8)

The substrate processing apparatus of any one of Supplementary Notes 4 to 6 may further include a controller configured to be capable of controlling the third gas supplier and the fourth gas supplier such that a partial pressure of the cleaning gas when the third gas supplier performs the cleaning of the exhaust buffer structure is higher than a partial pressure of the cleaning gas when the fourth gas supplier performs the cleaning on the support (Supplementary Note 9)

The substrate processing apparatus of any one of Supplementary Notes 4 to 6 may further include a controller configured to be capable of controlling the third gas supplier and the fourth gas supplier such that a frequency of the cleaning of the exhaust buffer structure performed by the third gas supplier is higher than a frequency of the cleaning performed on the support by the fourth gas supplier.

(Supplementary Note 10)

The substrate processing apparatus of any one of Supplementary Notes 4 to 6 may further include a controller configured to be capable of controlling the third gas supplier and the fourth gas supplier such that a supply time of the cleaning gas supplied by the third gas supplier to the exhaust buffer structure is longer than a supply time of the cleaning gas supplied by the fourth gas supplier onto the support.

(Supplementary Note 11)

The substrate processing apparatus of any one of Supplementary Notes 4 to 6 may further include a controller configured to be capable of controlling the third gas supplier and the fourth gas supplier such that the supply of the cleaning gas onto the support by the fourth gas supplier is stopped and the supply of the cleaning gas to the exhaust buffer structure by the third gas supplier is started after a predetermined time has elapsed from the supply of the cleaning gas onto the support by the fourth gas supplier.

(Supplementary Note 12)

The substrate processing apparatus of any one of Supplementary Notes 4 to 6 may further include a controller configured to be capable of controlling the third gas supplier and the fourth gas supplier such that the number of times the cleaning gas is supplied by the third gas supplier to the exhaust buffer structure is larger than the number of times the cleaning gas is supplied by the fourth gas supplier onto the support.

(Supplementary Note 13)

The substrate processing apparatus of any one of Supplementary Notes 4 to 6 may further include: a second activator configured to be capable of activating the cleaning gas supplied by the fourth gas supplier; and a controller configured to control the activator and the second activator such that an amount of activation energy of the activator with respect to the cleaning gas supplied by the third gas supplier is larger than an amount of activation energy of the second activator with respect to the cleaning gas supplied by the fourth gas supplier.

(Supplementary Note 14)

In the substrate processing apparatus of any one of Supplementary Notes 4 to 6, the cleaning gas supplied from the third gas supplier and the cleaning gas supplied from the fourth gas supplier may be different in components from each other (Supplementary Note 15)

The substrate processing apparatus of Supplementary Note 1 may further includes: an inert gas supplier configured to supply an inert gas into the process container; and a controller configured to be capable of controlling the inert gas supplier and the third gas supplier such that the inert gas is supplied from the inert gas supplier in parallel with the cleaning gas supply to the exhaust buffer structure by the third gas supplier.

(Supplementary Note 16)

In the substrate processing apparatus of Supplementary Note 15, the controller may be configured to be capable of controlling the inert gas supplier and the third gas supplier such that a partial pressure over the support is higher than a partial pressure in the exhaust buffer structure while the third gas supplier supplies the cleaning gas to the exhaust buffer structure.

(Supplementary Note 17)

In the substrate processing apparatus of Supplementary Note 15 or 16, the support may include through-holes through which lift pins configured to support the substrates pass, and the controller may be configured to be capable of controlling the inert gas supplier and the third gas supplier such that, while the third gas supplier supplies the cleaning gas to the exhaust buffer structure, a partial pressure over the through-holes is higher than a partial pressure in the exhaust buffer structure.

(Supplementary Note 18)

In the substrate processing apparatus of Supplementary Note 15, the third gas supplier may be arranged between the first gas supplier or the second gas supplier and exhaust holes included in the exhaust buffer structure in a gravity direction (vertical direction) and may be arranged between the first gas supplier and the second gas supplier in a direction (horizontal direction) orthogonal to the gravity direction.

(Supplementary Note 19)

In the substrate processing apparatus of Supplementary Note 1, the third gas supplier may be installed at a downstream side of a gas flow in a purge domain set between the first domain and the second domain.

(Supplementary Note 20)

In the substrate processing apparatus of Supplementary Note 1, the process container may include a gate valve capable of being opened and closed, and a passage provided between the gate valve and the support, and the third gas supplier may be configured to be capable of supplying the cleaning gas to the passage.

(Supplementary Note 21)

The substrate processing apparatus of Supplementary Note 1 may further include a controller configured to be capable of controlling the first gas exhauster, the second gas exhauster, and the third gas supplier such that: the supply of the cleaning gas from the third gas supplier to the exhaust buffer structure, stop of exhaust by the first gas exhauster, and execution of exhaust by the second gas exhauster are performed in parallel; or the supply of the cleaning gas from the third gas supplier to the exhaust buffer structure, execution of the exhaust by the first gas exhauster, and stop of the exhaust by the second gas exhauster are performed in parallel.

(Supplementary Note 22)

The substrate processing apparatus of Supplementary Note 1 may further include a controller configured to be capable of controlling the first gas exhauster, the second gas exhauster, and the third gas supplier such that: the supply of the cleaning gas from the third gas supplier to the exhaust buffer structure, and an exhaust control by which an amount of exhaust by the first gas exhauster becomes larger than an amount of exhaust by the second gas exhauster are performed in parallel; or the supply of the cleaning gas from the third gas supplier to the exhaust buffer structure, and an exhaust control by which the amount of exhaust by the first gas exhauster becomes smaller than the amount of exhaust by the second gas exhauster are performed in parallel.

(Supplementary Note 23)

The substrate processing apparatus of Supplementary Note 1 may further include a controller configured to be capable of controlling the first gas exhauster, the second gas exhauster, and the third gas supplier such that the supply of the cleaning gas from the third gas supplier to the exhaust buffer structure, stop of exhaust performed by the first gas exhauster, and stop of exhaust performed by the second gas exhauster are performed in parallel.

(Supplementary Note 24)

In the substrate processing apparatus of Supplementary Note 1, the third gas supplier may be installed at a downstream side of a gas flow in a purge domain set between the first domain and the second domain, and a distance in the purge domain between an outer peripheral wall constituting the exhaust buffer structure and the support is set smaller than a distance in the first domain between the outer peripheral wall and the support and a distance in the second domain between the outer peripheral wall and the support.

(Supplementary Note 25)

According to some embodiments of the present disclosure, there is provided a method of manufacturing a semiconductor device, including: supporting one or more substrates on a plane of a support installed inside a process container; processing the substrates by performing first gas supply from a first gas supplier to a first domain set in the process container, second gas supply from a second gas supplier to a second domain set in the process container, exhaust from a first gas exhauster connected to an exhaust buffer structure installed along an outer periphery of the support and installed at a downstream side of a gas flow generated by the first gas supplier, and exhaust from a second gas exhauster connected to the exhaust buffer structure and installed at a downstream side of a gas flow generated by the second gas supplier; unloading the substrates from the process container; and cleaning an inside of the exhaust buffer structure by supplying a cleaning gas from a third gas supplier connected to the exhaust buffer structure.

(Supplementary Note 26)

According to some embodiments of the present disclosure, there is provided a program that causes, by a computer, a substrate processing apparatus to perform a process including: supporting one or more substrates on a plane of a support installed inside a process container; processing the substrates by performing first gas supply from a first gas supplier to a first domain set in the process container, second gas supply from a second gas supplier to a second domain set in the process container, exhaust from a first gas exhauster connected to an exhaust buffer structure installed along an outer periphery of the support and installed at a downstream side of a gas flow generated by the first gas supplier, and exhaust from a second gas exhauster connected to the exhaust buffer structure and installed at a downstream side of a gas flow generated by the second gas supplier; unloading the substrates from the process container; and cleaning an inside of the exhaust buffer structure by supplying a cleaning gas from a third gas supplier connected to the exhaust buffer structure.

According to some embodiments of the present disclosure, it is possible to improve a cleaning efficiency of an exhaust system by supplying a cleaning gas to an exhaust buffer structure.

While certain embodiments are described above, these embodiments are presented by way of example and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a process container configured to process one or more substrates;
   a support installed inside the process container and configured to support the one or more substrates on a plane of the support;
   a first gas supplier configured to be capable of supplying a first gas to a first domain set in the process container;
   a second gas supplier configured to be capable of supplying a second gas to a second domain set in the process container;
   an exhaust buffer structure installed along an outer circumference of the support;
   a first gas exhauster connected to the exhaust buffer structure and installed at a downstream side of a flow of the first gas supplied from the first gas supplier;
   a second gas exhauster connected to the exhaust buffer structure and installed at a downstream side of a flow of the second gas supplied from the second gas supplier;
   a third gas supplier configured to be capable of supplying a first cleaning gas to the exhaust buffer structure;
   a fourth gas supplier configured to be capable of supplying a second cleaning gas onto the support; and
   a controller configured to control the third gas supplier and the fourth gas supplier to thereby control a frequency of each of the supplying of the first cleaning gas and the supplying of the second cleaning gas, a supply time of each of the first cleaning gas and the second cleaning gas, or a number of times for supplying each of the first cleaning gas and the second cleaning gas, such that over-etching in the support is prevented,
   wherein the third gas supplier is installed at a downstream side of a gas flow in a purge domain set between the first domain and the second domain,
   wherein a protrusion is provided at a portion of the exhaust buffer structure, which is adjacent to the purge domain, and is not provided at another portion of the exhaust buffer structure, which is adjacent to the first domain and the second domain, and
   wherein a distance in the purge domain between an outer peripheral wall constituting the exhaust buffer structure and the support is set to be smaller than a distance in the first domain between the outer peripheral wall and the support and a distance in the second domain between the outer peripheral wall and the support.

2. The substrate processing apparatus of claim 1, further comprising
   an activator configured to be capable of activating the first cleaning gas.

3. The substrate processing apparatus of claim 1,
   wherein the third gas supplier is configured to be capable of supplying the first cleaning gas capable of removing a carbon-containing film and a third cleaning gas capable of removing a carbon-free film, and
   wherein the third gas supplier is configured to supply the first cleaning gas and then supply the third cleaning gas when the first cleaning gas and the third cleaning gas are supplied to the exhaust buffer structure.

4. The substrate processing apparatus of claim 1, wherein the fourth gas supplier is installed higher than the third gas supplier in a gravity direction (vertical direction).

5. The substrate processing apparatus of claim 1, control the third gas supplier and the fourth gas supplier such that: a partial pressure of the first cleaning gas when the third gas supplier performs the cleaning of the exhaust buffer structure is higher than a partial pressure of the second cleaning gas when the fourth gas supplier performs the cleaning on the support; or a frequency of the cleaning of the exhaust buffer structure performed by the third gas supplier is higher than a frequency of the cleaning performed on the support by the fourth gas supplier.

6. The substrate processing apparatus of claim 1, wherein the controller is further configured to control the third gas supplier and the fourth gas supplier such that: a supply time of the first cleaning gas supplied by the third gas supplier to the exhaust buffer structure is longer than a supply time of the second cleaning gas supplied by the fourth gas supplier onto the support; the supply of the second cleaning gas onto the support by the fourth gas supplier is stopped and the supply of the first cleaning gas to the exhaust buffer structure by the third gas supplier is started after a predetermined time has elapsed from the supply of the second cleaning gas onto the support by the fourth gas supplier; or the number of times the first cleaning gas is supplied by the third gas supplier to the exhaust buffer structure is larger than the number of times the second cleaning gas is supplied by the fourth gas supplier onto the support.

7. The substrate processing apparatus of claim 1, further comprising:
   a first activator configured to be capable of activating the first cleaning gas supplied by the third gas supplier; and
   a second activator configured to be capable of activating the second cleaning gas supplied by the fourth gas supplier, and
   wherein the controller is further configured to control the first activator and the second activator such that an amount of activation energy of the first activator with respect to the first cleaning gas supplied by the third gas supplier is larger than an amount of activation energy of the second activator with respect to the second cleaning gas supplied by the fourth gas supplier.

8. The substrate processing apparatus of claim 1, wherein the third gas supplier is connected to a first cleaning gas supply source,
   wherein the fourth gas supplier is connected to a second cleaning gas supply source, and wherein the first cleaning gas supplied from the third gas supplier and the second cleaning gas supplied from the fourth gas supplier are different in components from each other.

9. The substrate processing apparatus of claim 1, further comprising:
an activator configured to be capable of activating the first cleaning gas; and
a heater configured to be capable of heating the support,
wherein the third gas supplier is configured to supply the first cleaning gas to the exhaust buffer structure in a state in which the activator is in operation, and
wherein the fourth gas supplier is configured to supply the second cleaning gas onto the support in a state in which the heater is in operation.

10. The substrate processing apparatus of claim 1, further comprising:
an inert gas supplier configured to supply an inert gas into the process container;
wherein the controller is further configured to control the inert gas supplier and the third gas supplier such that the inert gas is supplied from the inert gas supplier in parallel with the supply of the first cleaning gas to the exhaust buffer structure by the third gas supplier.

11. The substrate processing apparatus of claim 10, wherein the controller is configured to control the inert gas supplier and the third gas supplier such that a partial pressure over the support is higher than a partial pressure in the exhaust buffer structure while the third gas supplier supplies the first cleaning gas to the exhaust buffer structure.

12. The substrate processing apparatus of claim 10, wherein the support includes through-holes through which lift pins configured to support the substrates pass, and
wherein the controller is configured to control the inert gas supplier and the third gas supplier such that, while the third gas supplier supplies the first cleaning gas to the exhaust buffer structure, a partial pressure over the through-holes is higher than a partial pressure in the exhaust buffer structure.

13. The substrate processing apparatus of claim 1, wherein the third gas supplier is arranged between the first gas supplier or the second gas supplier and exhaust holes included in the exhaust buffer structure in a gravity direction and is arranged between the first gas supplier and the second gas supplier in a direction orthogonal to the gravity direction.

14. The substrate processing apparatus of claim 1, wherein the process container includes a gate valve capable of being opened and closed, and a passage provided between the gate valve and the support, and
wherein the third gas supplier is configured to be capable of supplying the first cleaning gas to the passage.

15. The substrate processing apparatus of claim 1, wherein the controller is further configured to control the first gas exhauster, the second gas exhauster, and the third gas supplier such that: the supply of the first cleaning gas from the third gas supplier to the exhaust buffer structure, stop of the exhaust by the first gas exhauster, and execution of exhaust by the second gas exhauster are performed in parallel; or the supply of the first cleaning gas from the third gas supplier to the exhaust buffer structure, execution of the exhaust by the first gas exhauster, and stop of the exhaust by the second gas exhauster are performed in parallel.

16. The substrate processing apparatus of claim 1, wherein the controller is further configured to control the first gas exhauster, the second gas exhauster, and the third gas supplier such that: the supply of the first cleaning gas from the third gas supplier to the exhaust buffer structure, and an exhaust control by which an amount of exhaust by the first gas exhauster becomes larger than an amount of exhaust by the second gas exhauster are performed in parallel; or the supply of the first cleaning gas from the third gas supplier to the exhaust buffer structure, and an exhaust control by which the amount of exhaust by the first gas exhauster becomes smaller than the amount of exhaust by the second gas exhauster are performed in parallel.

17. The substrate processing apparatus of claim 1, wherein the controller is further configured to control the first gas exhauster, the second gas exhauster, and the third gas supplier such that the supply of the first cleaning gas from the third gas supplier to the exhaust buffer structure, stop of the exhaust performed by the first gas exhauster, and stop of the exhaust performed by the second gas exhauster are performed in parallel.

* * * * *